(12) United States Patent
Tabata et al.

(10) Patent No.: US 11,007,497 B2
(45) Date of Patent: *May 18, 2021

(54) GAS JETTING APPARATUS

(71) Applicant: Toshiba Mitsubishi-Electric Industrial Systems Corporation, Chuo-ku (JP)

(72) Inventors: Yoichiro Tabata, Tokyo (JP); Kensuke Watanabe, Tokyo (JP); Shinichi Nishimura, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/516,598

(22) PCT Filed: Oct. 29, 2014

(86) PCT No.: PCT/JP2014/078725
§ 371 (c)(1),
(2) Date: Apr. 3, 2017

(87) PCT Pub. No.: WO2016/067381
PCT Pub. Date: May 6, 2016

(65) Prior Publication Data
US 2018/0200687 A1    Jul. 19, 2018

(51) Int. Cl.
*H01L 21/67* (2006.01)
*C23C 16/54* (2006.01)
(Continued)

(52) U.S. Cl.
CPC ............... *B01J 4/002* (2013.01); *B01J 4/00* (2013.01); *B01J 4/008* (2013.01); *C23C 14/228* (2013.01);
(Continued)

(58) Field of Classification Search
CPC ......... H05H 1/2406; H05H 2001/2412; H05H 2001/2418; H05H 2001/2431;
(Continued)

(56) References Cited

U.S. PATENT DOCUMENTS 3,850,679 A   11/1974   Spoko et al.
4,619,597 A   10/1986   Miller
(Continued)

FOREIGN PATENT DOCUMENTS

EP    1 282 470 B1    8/2008
EP    3 214 204    *    9/2017    ........... C23C 16/455
(Continued)

OTHER PUBLICATIONS

Translation of JP 2008-218254.*
(Continued)

*Primary Examiner* — Mary A Wilczewski
(74) *Attorney, Agent, or Firm* — Xsensus LLP

(57) ABSTRACT

A gas jetting apparatus capable of uniformly jetting, even onto a treatment-target object having a high-aspect-ratio groove, a gas into the groove. The gas jetting apparatus includes a gas jetting cell unit for jetting a gas toward a treatment-target object. The gas jetting cell unit includes a first cone-shaped member and a second cone-shaped member. A gap is formed between a side surface of a first cone shape and a side surface of the second cone-shaped member. Apex sides of the cone-shaped members face the treatment-target object.

16 Claims, 17 Drawing Sheets

(51) Int. Cl.
- *C23C 16/455* (2006.01)
- *B01J 4/00* (2006.01)
- *H05H 1/24* (2006.01)
- *H01L 21/31* (2006.01)
- *C23C 14/22* (2006.01)

(52) U.S. Cl.
CPC ...... *C23C 16/455* (2013.01); *C23C 16/45565* (2013.01); *H01L 21/31* (2013.01); *H05H 1/24* (2013.01); *H05H 1/2406* (2013.01); *H05H 2001/2462* (2013.01)

(58) Field of Classification Search
CPC .......... H05H 2001/2462; C23C 14/228; C23C 16/45565; C23C 16/455; B01J 4/002; B01J 4/008; H01L 21/31; H01L 21/67011
See application file for complete search history.

(56) References Cited

U.S. PATENT DOCUMENTS

| | | | |
|---|---|---|---|
| 5,643,394 A | 7/1997 | Maydan et al. | |
| 6,132,512 A | 10/2000 | Horie et al. | |
| 6,419,752 B1 * | 7/2002 | Shvets | C23C 16/04 118/500 |
| 6,764,720 B2 | 7/2004 | Pui et al. | |
| 7,498,063 B2 | 3/2009 | Pui et al. | |
| 9,050,611 B2 | 6/2015 | Pui et al. | |
| 2003/0047282 A1 | 3/2003 | Sago et al. | |
| 2003/0057848 A1 | 3/2003 | Yuasa et al. | |
| 2007/0012249 A1 | 1/2007 | Miyazawa | |
| 2007/0199824 A1 | 8/2007 | Hoerr et al. | |
| 2008/0053614 A1 | 3/2008 | Sago et al. | |
| 2008/0156440 A1 | 7/2008 | Sago et al. | |
| 2009/0035951 A1 | 2/2009 | Miya | |
| 2009/0173444 A1 | 7/2009 | Sago et al. | |
| 2009/0188626 A1 | 7/2009 | Lu et al. | |
| 2009/0266924 A1 | 10/2009 | Pui et al. | |
| 2010/0132615 A1 | 6/2010 | Kato et al. | |
| 2010/0193129 A1 | 8/2010 | Tabata | |
| 2011/0174902 A1 | 7/2011 | Pui et al. | |
| 2011/0229627 A1 | 9/2011 | Hoerr et al. | |
| 2013/0115780 A1 | 5/2013 | Okumura | |
| 2013/0130512 A1 | 5/2013 | Kato et al. | |
| 2013/0323403 A1 | 12/2013 | Hoerr et al. | |
| 2014/0199499 A1 | 7/2014 | Van Kessel et al. | |
| 2014/0199500 A1 | 7/2014 | Van Kessel et al. | |
| 2015/0352592 A1 | 12/2015 | Hoerr et al. | |
| 2017/0275758 A1 * | 9/2017 | Tabata | C23C 16/45561 |

FOREIGN PATENT DOCUMENTS

| | | | | |
|---|---|---|---|---|
| EP | 3 214 205 | * | 9/2017 | ........... C23C 16/455 |
| JP | 49-89717 | | 8/1974 | |
| JP | 5-152350 A | | 6/1993 | |
| JP | 7-29827 A | | 1/1995 | |
| JP | 2000-183045 | * | 6/2000 | ......... H01L 21/3065 |
| JP | 2001-135628 A | | 5/2001 | |
| JP | 2004-111739 A | | 4/2004 | |
| JP | 2004-307892 A | | 11/2004 | |
| JP | 2007-266489 A | | 10/2007 | |
| JP | 2008-218254 A | | 9/2008 | |
| JP | 2011-129703 A | | 6/2011 | |
| JP | 2012-255203 A | | 12/2012 | |
| WO | WO 98/40533 A1 | | 9/1998 | |
| WO | 2010/099218 A1 | | 9/2010 | |
| WO | WO 2010/143746 A1 | | 12/2010 | |
| WO | WO 2016/067379 | * | 5/2016 | ........... C23C 16/455 |
| WO | WO 2016/067381 | * | 5/2016 | ........... C23C 16/455 |

OTHER PUBLICATIONS

Extended European Search Report dated May 16, 2018 in Patent Application No. 14904758.1 citing references AA-AI and AO-AR therein. 11 pages.
Japanese Office Action dated Sep. 5, 2017 in Japanese Patent Application No. 2016-556095 (with English translation).
International Preliminary Report on Patentability and Written Opinion of the International Searching Authority dated May 11, 2017 in PCT/JP2014/078725 filed Oct. 29, 2014 (with English translation).
Taiwanese Office Action dated Jan. 26, 2017 in corresponding Taiwanese Application No. 104100695 (with partial English translation).
International Search Report dated Jan. 20, 2015 in PCT/JP2014/078725 filed Oct. 29, 2014.
Office Action dated Sep. 3, 2018 in Korean Patent Application No. 10-2017-7010643 (with English translation).
Combined Office Action and Search Report dated Nov. 2, 2018 in Chinese Patent Application No. 201480083012.3 (with English translation).
European Office Action dated Jun. 25, 2019 in Patent Application No. 14 905 132.8, 7 pages.
Combined Office Action and Search Report dated Nov. 2, 2018 in Chinese Patent Application No. 201480082990.6 (with English language translation).
European Office Action dated Nov. 23, 2018 in Patent Application No. 14 905 132.8.
Office Action dated Aug. 8, 2018 in Korean Patent Application No. 10-2017-7010043 (with English translation).
Extended Search Report dated May 4, 2018 in European Patent Application No. 14905132.8.
Office Action dated Jan. 9, 2018 in Japanese Patent Application No. 2016-556093 (with partial English language translation) 8 pages.
Office Action dated Sep. 5, 2017 in Japanese Patent Application No. 2016-556093 (with partial English language translation).
International Preliminary Report on Patentability and Written Opinion dated May 11, 2017 in PCT/JP2014/078722 (with English Translation).
Taiwanese Office Action dated Sep. 9, 2016 in corresponding Taiwanese Application No. 104133835 (with partial English translation).
International Search Report dated Jan. 20, 2015 in PCT/J P2014/078722 filed Oct. 29, 2014.
Communication Pursuant to Article 94(3) dated Feb. 12, 2021 in European Patent Application 14 904 758.1.

* cited by examiner

F I G. 5
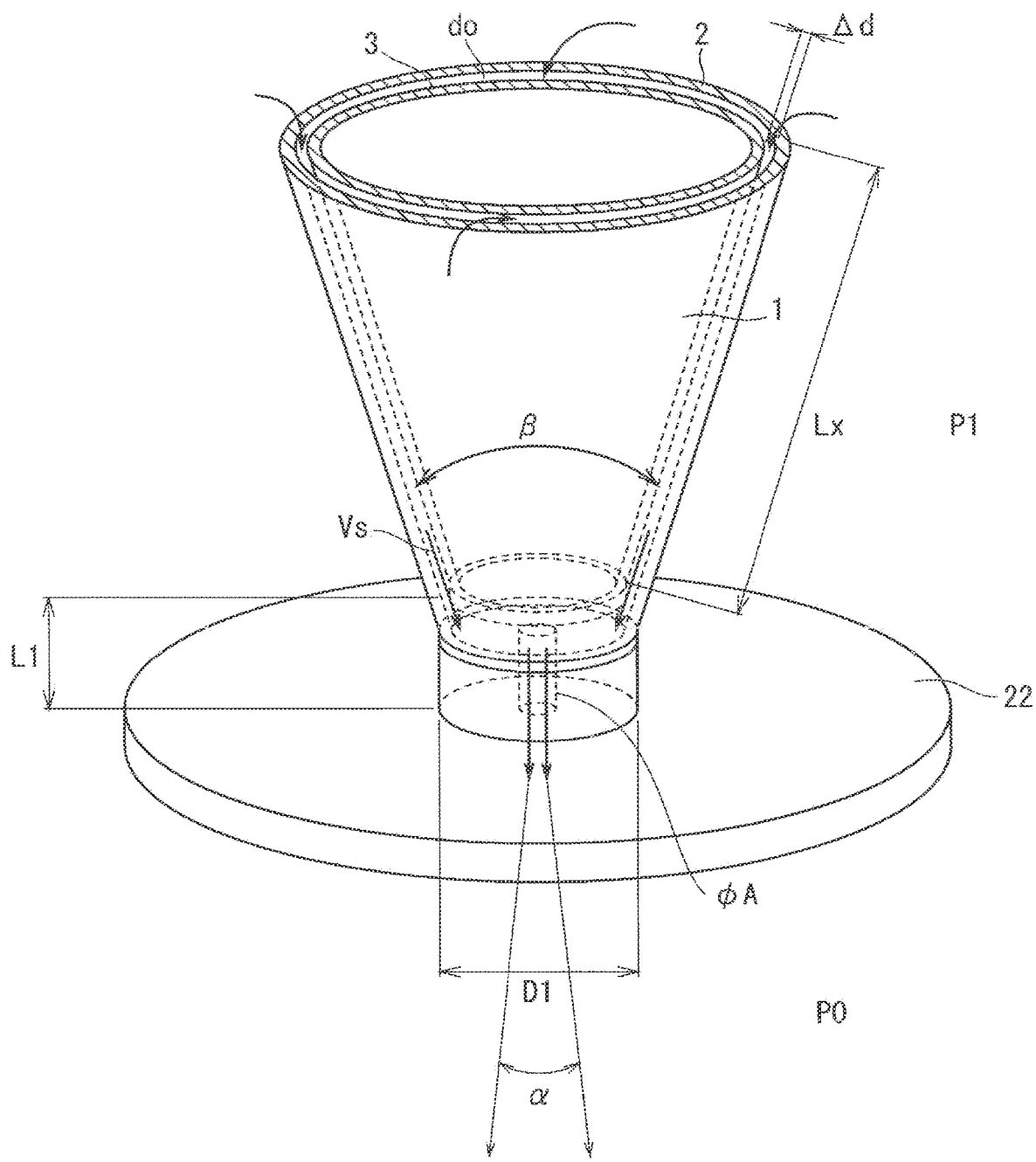

GAS JETTING APPARATUS

TECHNICAL FIELD

The present invention relates to a gas jetting apparatus for jetting non-heated, heated, and discharge gases based on a jetting method capable of jetting out at a higher velocity having directivity gas species of non-heated, heated, and discharge gases useful for treating a treatment-target object placed under a reduced pressure atmosphere in a treatment chamber.

BACKGROUND ART

In various application fields including a semiconductor manufacturing field multi-function, high quality thin films (for example, high insulation thin films, semiconductor thin films, high dielectric thin films, light-emitting thin films, high magnetic thin films, and super-hard thin films) have been demanded.

For example, in scenes of manufacturing semiconductor apparatuses, semiconductor chips are formed with, for example, a high conductive film having a lower impedance so as to correspond to circuit wiring, a high magnetic film having a circuit wiring and coil function and a magnetic function, a high dielectric film having a circuit capacitor function, and high insulation film having a high insulation function with less-electrical leakage current.

As convectional technologies for forming these films, for example, thermal Chemical Vapor Deposition (CVD) apparatuses, optical CVD apparatuses, and plasma CVD apparatuses have been used, in particular, a plasma CVD apparatus has often been used. Because a plasma CVD apparatus is superior, than thermal and optical CVD apparatuses, in film formation treatment capability at a lower film formation temperature and at a higher film formation velocity in a shorter period of time, for example.

For example, when a gate insulating film such as a nitride film (SiON, HfSiON, etc.) or an oxide film ($SiO_2$, $HfO_2$) is formed onto a semiconductor substrate, a technology using a plasma CVD apparatus under a reduced pressure atmosphere as described below is widely used.

That is, a gas such as $NH_3$ (ammonia) and $N_3$, $O_2$, $O_3$ (ozone), and a precursor gas (non-heated gas) such as silicon and hafnium are directly supplied into a treatment chamber apparatus in which a CVD treatment will be implemented. In the treatment chamber apparatus, the precursor gas is dissociated through heat or a discharge of electricity to produce metallic particles, and then, through a chemical reaction between the metallic particles and the above described non-heated gas such as $NH_3$ (ammonia) using heat or a discharge of electricity, a thin film such as a nitride film or an oxide film is formed onto a treatment-target object.

On the other hand, in a plasma CVD apparatus, high frequency plasma or microwave plasma is directly generated in a treatment chamber apparatus. Therefore, a treatment-target object is exposed to a radical gas or high energy plasma ions (or electrons).

As a prior art document disclosing a technology relating to a plasma CVD apparatus, for example, Patent Document 1 exists.

However, in a film formation treatment performed in a plasma CVD apparatus, as described above, a treatment-target object is directly exposed to plasma. Therefore, the treatment-target object is often damaged by the plasma (ions and electrons), thus a performance of a semiconductor function has been significantly lowered.

On the other hand, in a film formation treatment using a thermal or optical CVD apparatus, a treatment-target object is free from damage by plasma (ions and electrons), and is formed with a high quality nitride film, an oxide film, or another film. However, in the film formation treatment, it is difficult to obtain a high density, large amount radical gas source, and, as a result, a film formation requires an extremely longer period of time.

Recent thermal and optical CVD apparatuses use, as a source gas, a high density $NH_3$ gas or $O_3$ gas that easily dissociates by heat or irradiated light. In addition, in a CVD chamber apparatus, a heating catalyst carrier is provided. Therefore, with the thermal and optical CVD apparatuses, a catalytic action facilitates gas dissociation, thus a nitride film, an oxide film, or another film can be formed in a shorter period of time. However, the shortened period of time is limited, thus significant improvement in film formation has been difficult.

As an apparatus capable of reducing damage to a treatment-target object due to plasma, and further shortening a period of time for film formation, a remote plasma type film formation treatment system exists (for example, see Patent Document 2).

In a technology according to Patent Document 2, a plasma generating area and a treatment-target material treating area are separated by a partition (plasma confinement electrode). Specifically, in the technology according to Patent Document 2, the plasma confinement electrode is provided between a high frequency applying electrode and an opposite electrode to which a treatment-target object is placed. Therefore, in the technology according to Patent Document 2, only neutral active species are supplied onto the treatment-target object.

In addition, in the technology according to Patent Document 3, in a remote plasma source, a source gas is partially activated by plasma. In here, a gas flow channel is surrounded in the remote plasma source. An activated gas generated in the remote plasma source is discharged and supplied toward an apparatus in which a treatment-target object is present.

With the thin film technology described in Patent Document 3, various source gases are used, such as nitrogen, oxygen, ozone, and hydrogen. From the source gas, an activated radical gas is generated, and, by the radical gas, a thin film is formed onto a treatment-target object.

The radical gas is highly reactive. Therefore, by allowing a radical gas at a trace concentration (approximately 1%: 10000 ppm) in maximum to come into contact with a treatment-target object, a chemical reaction is facilitated on the treatment-target object, thus a nitride thin film, an oxide thin film, or a hydrogen bonding thin film can effectively be formed in a short period of time.

A radical gas generating apparatus is provided with a discharge cell to achieve, in the discharge cell, higher electrical field plasma through dielectric barrier discharge equivalent to atmospheric pressure plasma. Therefore, from the source gas exposed to plasma in the discharge cell, a high quality radical gas is generated.

In addition, in a CVD apparatus, when a treatment using a gas is to be implemented for a treatment-target object (wafer substrate), the CVD apparatus provided with the treatment-target object is internally heated and decompressed. In the CVD apparatus, an organic metallic compound steam gas (precursor gas) is filled, and, for facilitating oxidation, nitriding, and reduction, an ozone gas, water vapor, a hydrogen gas, or a radical gas (an oxygen radical gas, a nitrogen radical gas, a hydrogen radical gas, or another gas) is supplied. Therefore, in the CVD apparatus, by allowing oxidation substances, nitride substances, and other substances accumulated on the treatment-target object surface to thermally diffuse, a function film such as a semiconductor film, an insulating film, or another film can crystal grow on the treatment-target object surface.

Each of various gases (ozone gas, water vapor, hydrogen gas, or radical gas) to be supplied into the CVD apparatus together with a precursor gas as described above is hereinafter referred to as a film formation treatment gas.

PRIOR ART DOCUMENTS

Patent Documents

Patent Document 1: Japanese Patent Application Laid-Open No. 2007-266489
Patent Document 2: Japanese Patent Application Laid-Open No. 2001-135628
Patent Document 3: Japanese Patent Application Laid-Open No. 2004-111739

SUMMARY OF INVENTION

Problems to be Solved by the Invention

Conventionally, to configure a function element (2D (dimension) element) such as a semiconductor on a treatment-target object, surface film formation through which a precursor gas or a film formation treatment gas is filled in a CVD treatment vessel has mainly been used.

For example, in a decompressed CVD apparatus in which a treatment-target object or a plurality of treatment-target objects is provided, a gas is showered and jetted out, via a plurality of nozzle holes, from a shorter gas supply pipe having a predetermined bore. Since the gas supplied from the shorter gas supply pipe having the predetermined bore is jetted out without fully rectified, the jetted out gas is diffused all around at a diffusion velocity that depends on an atmosphere gas pressure and a gas density difference.

On the other hand, due to demands of further higher dense function elements, three dimensional function elements (3D elements) formed laminated with a plurality of function elements have been demanded. That is, uniformly forming into a high-aspect-ratio groove a desired film has been demanded.

However, as described above, when a gas is diffused and jetted all around, the gas is not uniformly radiated in the high-aspect-ratio groove. Under this condition, a uniform film cannot be formed in the groove.

Therefore, for a treatment-target object, a film formation technology capable of uniformly jetting a gas into a high-aspect-ratio groove has been demanded.

The present invention has an object to provide a gas jetting apparatus capable of uniformly jetting, even onto a treatment-target object having a high-aspect-ratio groove, a gas into the groove.

Means for Solving the Problems

To achieve the above described object, a gas jetting apparatus according to the present invention includes a vessel unit, a gas supply unit for supplying a gas to the vessel unit, and a gas jetting cell unit provided in the vessel unit to jet the gas toward a treatment-target object. The gas jetting cell unit includes a first cone-shaped member, and a second cone-shaped member disposed to surround the first cone-shaped member in a side surface direction so that a gap is formed with a side surface of the first cone-shaped member. An apex side of the first cone-shaped member and an apex side of the second cone-shaped member face the treatment-target object. The gas supplied from the gas supply unit enters from a bottom surface side of the first cone-shaped member and a bottom surface side of the second cone-shaped member into the gap, passes through the gap, and is jetted from the apex side of the first cone-shaped member and the apex side of the second cone-shaped member toward the treatment-target object.

In addition, a vessel unit, a gas supply unit for supplying a gas to the vessel unit, and a gas jetting cell unit provided in the vessel unit to jet the gas toward a treatment-target object are further included. The gas jetting cell unit has a fan shape, and includes a first flat plate, and a second flat plate disposed to face the first flat plate to form a gap. An apex side of the gas jetting cell unit faces the treatment-target object. The gas supplied from the gas supply unit enters from an opening on a wider width side of the fan-shaped gas jetting cell unit 1 into the gap, passes through the gap, and is jetted from the apex side of the gas jetting cell unit toward the treatment-target object.

Effects of the Invention

A gas jetting apparatus according to the present invention includes a vessel unit, a gas supply unit for supplying a gas to the vessel unit, and a gas jetting cell unit provided in the vessel unit to jet the gas toward a treatment-target object. The gas jetting cell unit includes a first cone-shaped member, and a second cone-shaped member disposed to surround the first cone-shaped member in a side surface direction so that a gap is formed with a side surface of the first cone-shaped member. An apex side of the first cone-shaped member and an apex side of the second cone-shaped member face the treatment-target object. The gas supplied from the gas supply unit enters from a bottom surface side of the first cone-shaped member and a bottom surface side of the second cone-shaped member into the gap, passes through the gap, and is jetted from the apex side of the first cone-shaped member and the apex side of the second cone-shaped member toward the treatment-target object.

In addition, a vessel unit, a gas supply unit for supplying a gas to the vessel unit, and a gas jetting cell unit provided in the vessel unit to jet the gas toward a treatment-target object are further included. The gas jetting cell unit has a fan shape, and incudes a first flat plate, and a second flat plate disposed to face the first flat plate to form a gap. An apex side of the gas jetting cell unit faces the treatment-target object. The gas supplied from the gas supply unit enters from an opening on a wider width side of the fan-shaped gas jetting cell unit 1 into the gap, passes through the gap, and is jetted from the apex side of the gas jetting cell unit toward the treatment-target object.

Therefore, in the gap of the gas jetting cell unit, the gas is rectified and accelerated. Therefore, a gas can be jetted in a beam shape having directivity from the gas jetting cell unit. Therefore, the gas jetting apparatus can uniformly jet, even onto a treatment-target object having a high-aspect-ratio groove, the gas into the groove, and, as a result, a uniform film can be formed in the groove.

BRIEF DESCRIPTION OF DRAWINGS

FIG. 5 is a view illustrating how a gas is jetted out from the gas jetting cell unit 1 as a beam having directivity.

DESCRIPTION OF EMBODIMENTS

Figure 1:
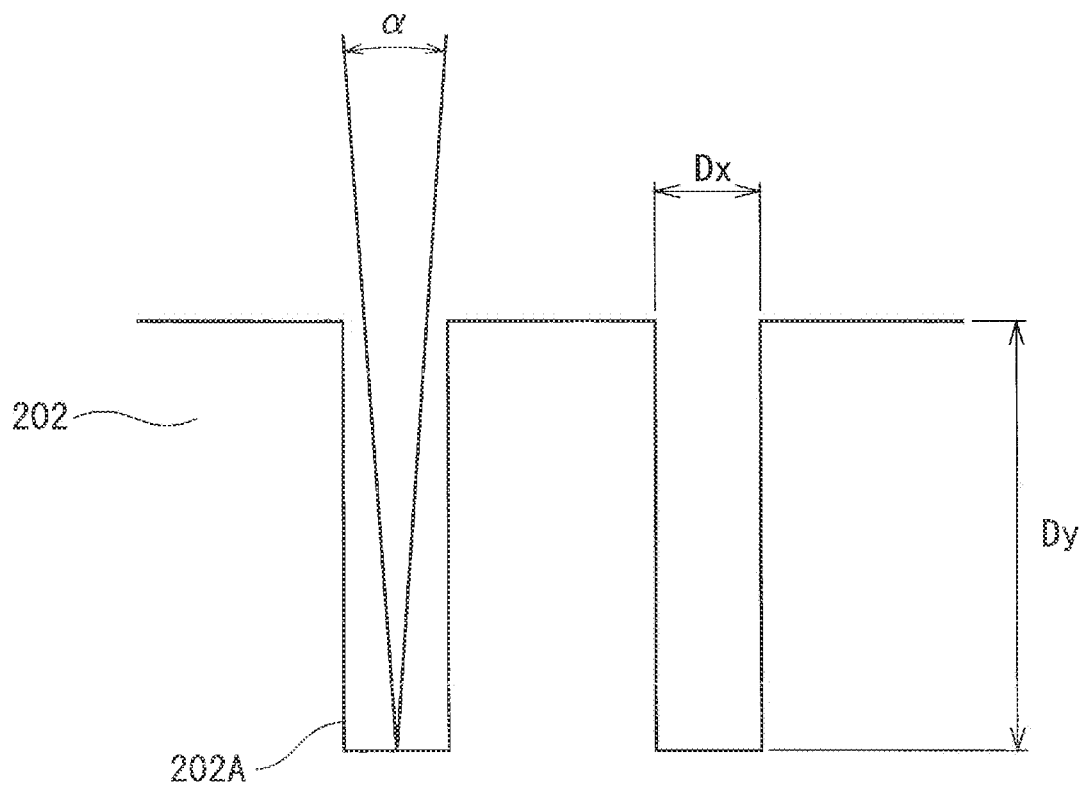
FIG. 1 is an enlarged sectional view illustrating a cross-sectional configuration of a part of a treatment-target object 202 having a high-aspect-ratio groove 202A.

FIG. 1 is an enlarged sectional view illustrating a cross-sectional configuration of a part of a treatment-target object 202 having a high-aspect-ratio groove 202A.

In FIG. 1, Dx represents a bore of a groove 202A, while Dy represents a depth of the groove 202A. For example, the bore Dx has a diameter of approximately several ten μm, while the depth Dy has a value in a range from approximately several times to several ten times of the bore Dx. For the high-aspect-ratio (Dy/Dx) groove 202A shown in FIG. 1, uniform film formation is required (in other words, with gas jetting, the gas should uniformly be supplied to a bottom of the high-aspect-ratio groove 202A).

A conventional method for jetting a gas from a shorter gas supply pipe having a predetermined bore is appropriate for uniformly and fully filling the gas inside an apparatus. However, with the gas jetting out method, in the gas supply pipe, neither the gas is fully rectified nor the gas is fully accelerated, which results in weak directivity of the jetted out gas and a lower gas velocity, that is, the gas does not fully enter into the high-aspect-ratio groove 202A internally, and it is difficult to uniformly form a film onto a bottom surface and a side surface of the groove 202A. In addition, a gas life of the supplied radical gas is extremely shorter, thus the gas could disappear before the gas reaches the bottom surface of the groove 202A. Therefore, it is difficult to uniformly form a film.

Therefore, to uniformly form a film in the high-aspect-ratio groove 202A, it is necessary to allow a jetted out gas to have directivity, and to accelerate to allow the gas to flow at a higher velocity. That is, it is necessary that the more an aspect ratio of the groove 202A is, the less a beam angle α of a jetted-out gas is (i.e. such gas jetting which allows a gas to flow at a higher velocity having strong directivity so that the jetted-out gas overcomes a diffusion velocity and the gas is prevented from being expanded is required).

A gas jetting apparatus for jetting a non-heated gas, a heated gas, and a discharge gas, according to the present invention (hereinafter simply referred to as a gas jetting apparatus) is capable of jetting out a precursor gas or a film formation treatment gas in a beam shape to uniformly form a film in a high-aspect-ratio groove 202A. The present invention will now specifically be described herein with reference to the drawings illustrating its exemplary embodiments.

First Exemplary Embodiment

Figure 2:
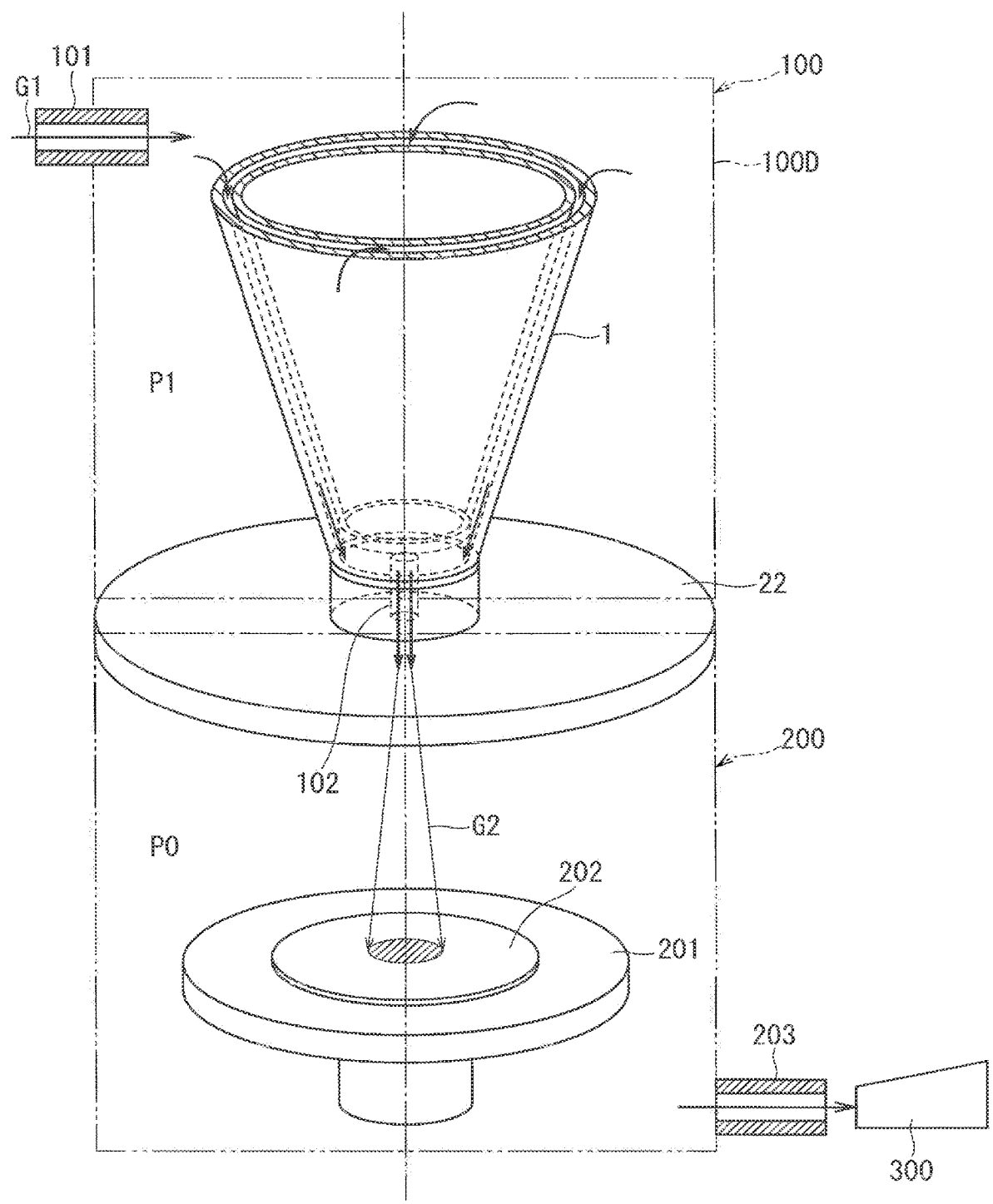
FIG. 2 is a perspective view schematically illustrating a configuration of a remote plasma type film formation treatment system configured to include a gas jetting apparatus 100 and a treatment chamber 200 according to a first exemplary embodiment.

FIG. 2 is a perspective view schematically illustrating a configuration of a remote plasma type film formation treatment system configured to include a gas jetting apparatus 100 and a treatment chamber 200 according to this exemplary embodiment.

The gas jetting apparatus 100 and the treatment chamber 200 are partitioned by a flange 22. That is, the flange 22 is a member for joining the gas jetting apparatus 100 and the treatment chamber 200, where a main surface of the flange 22 configures a bottom surface of the gas jetting apparatus 100, while another main surface of the flange 22 configures a top surface of the treatment chamber 200. In here, the gas jetting apparatus 100 and the treatment chamber 200 are internally coupled each other via a jetting-out hole 102.

As shown in FIG. 2, the gas jetting apparatus 100 includes a vessel unit 100D, a gas supply unit 101, and a gas jetting cell unit 1.

The gas supply unit 101 supplies a gas G1 into the vessel unit 100D. In here, gas pressure P1 in the vessel unit 100D is kept constant to a value in a rage from 10 kPa to 50 kPa inclusive. In addition, in the vessel unit 100D, the hollow, conical gas jetting cell unit 1 for jetting a gas is provided. The gas jetting cell unit 1 has the jetting-out hole 102, and a gas G2 is jetted via the jetting-out hole 102 into the treatment chamber 200 (more specifically, jetted onto a treatment-target object 202 in the treatment chamber 200). In here, an opening size of the jetting-out hole 102 is, for example, 1 mm or smaller.

Inside the treatment chamber 200 that is a CVD apparatus, a table 201 is provided. On the table 201, the treatment-target object 202 is placed. In here, the treatment-target object 202 has, as shown in FIG. 1, a higher aspect groove 202A.

The treatment chamber 200 is coupled with a vacuum pump 300 via an evacuation port 203. The vacuum pump maintains gas pressure P0 in the treatment chamber 200 to a value in a range from approximately 30 Pa to 400 Pa inclusive.

In FIG. 2, a precursor gas G1 or a source gas G1 that can be regarded as a radical gas is supplied, via the gas supply unit 101, into the vessel unit 100D at a predetermined flow rate. The source gas G1 passes through the gas jetting cell unit 1, and is jetted out as a precursor gas G2 or a radical gas G2 from the jetting-out hole 102 into the treatment chamber 200. The gas G2 is radiated in a beam shape toward the treatment-target object 202 placed on the table 201 to form a film on a radiated area.

Figure 3:
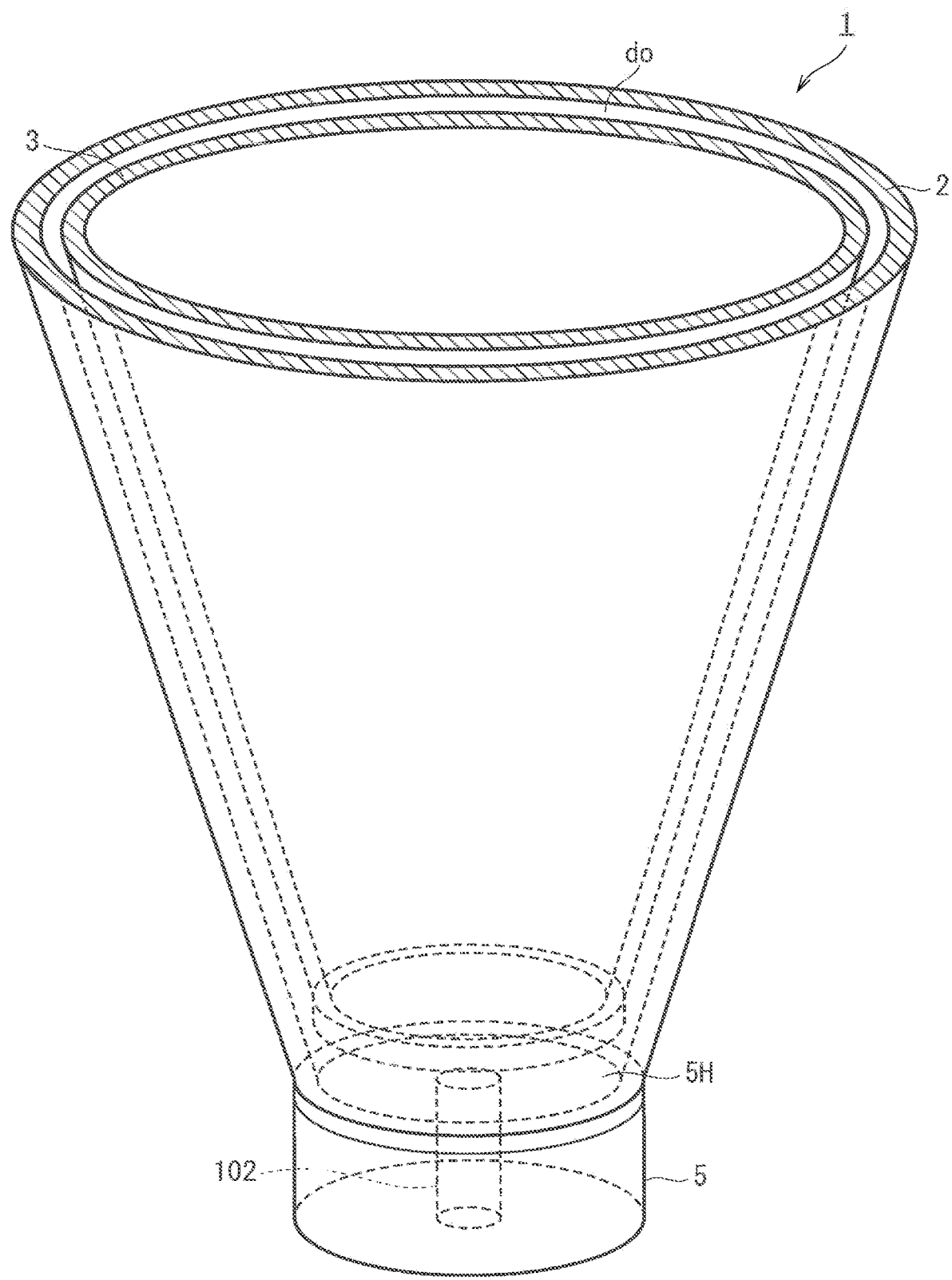
FIG. 3 is an enlarged perspective view illustrating a configuration of a gas jetting cell unit 1.

FIG. 3 is an enlarged perspective view illustrating a configuration of the gas jetting cell unit 1 provided in the gas jetting apparatus 100. The hollow, conical gas jetting cell unit 1 will now be described herein. However, the gas jetting cell unit 1 may have a hollow, polygonal cone shape.

The gas jetting cell unit 1 is configured to include a first cone-shaped member 3 that is an inner pipe, a second cone-shaped member 2 that is an outer pipe, and a jetting-out unit 5.

The first cone-shaped member 3 has a truncated cone shape (may be conical), and has a first hollow portion. In here, the first hollow portion also has a truncated cone shape. In addition, the second cone-shaped member 2 is provided so as to surround the first cone-shaped member 3 from a side surface side. In here, the second cone-shaped member 2 has a truncated cone shape, and has a second hollow portion. The second hollow portion also has a truncated cone shape. In addition, a cone angle of the first cone-shaped member 3 and a cone angle of the second cone-shaped member 2 are identical. That is, a width $\Delta d$ of a gap do described later is constant.

That is, the first cone-shaped member 3 is provided in the second hollow portion of the second cone-shaped member 2, and the gap do that has a ring shape when viewed in plane is formed between a side surface portion of the first cone-shaped member 3 and a side surface portion of the second cone-shaped member 2. A central axis of the first cone-shaped member 3 and a central axis of the second cone-shaped member 2 match.

In here, a portion of the first cone-shaped member 3, which faces the gap do, and a portion of the second cone-shaped member 2, which faces the gap do, are made of, for example, sapphire or quartz. In addition, for the width $\Delta d$ of the gap do (i.e. a distance from a side surface of the first cone-shaped member 3 to a side surface of the second cone-shaped member 2), for example, a diameter D of a cone is φ40 mm, while the width $\Delta d$ of the gap do of the cone, inside which is a gas route, is a value in a range from a 0.3 mm to 3 mm inclusive. In addition, since gas pressure P1 in the vessel unit 100D is kept constant to a value in a range from 10 kPa to 50 kPa inclusive, gas pressure in the gap do is also kept constant to a value in a range from 10 kPa to 50 kPa inclusive. A gas jetting cell unit 1 is formed into a cone shape (cone) with the width of the gap do specified to $\Delta d$ in order to lower gas pressure to P1. Therefore, when a flow rate Q of a gas to be supplied to the gas jetting apparatus 100 is set to 1 L/min, the gas to be flowed into the gas jetting cell unit 1 becomes the gas having a higher flow velocity Vs0 as expressed by an equation shown below. $Vs0=100/P1 \cdot [1000 \cdot Q/\{(D/10) \cdot \pi \cdot (\Delta d/10)\}]$ (cm/s). When the gas having the flow velocity Vs0 is rectified into a gas flow in a predetermined direction in the gas jetting cell unit 1, and the gas passes through the cell, the gas is accelerated to a further high velocity of a gas velocity Vs for jetting out.

As described above, the cone-shaped members 2, 3 have truncated cone shapes. With the gas jetting cell unit 1 provided in the vessel unit 100D, diameters of the truncated cone shapes reduce from an upper side to a lower side of the vessel unit 100D (toward the treatment chamber 200).

In addition, as shown in FIG. 3, on a side facing the treatment chamber 200 (i.e. sides that can be regarded as apices of the cones of the cone-shaped members 2, 3), the jetting-out unit 5 is provided for jetting a gas toward the treatment-target object 202. As can be understood from the configurations shown in FIGS. 2, 3, the sides that can be regarded as the apices of the cone-shaped members 2, 3 (in other words, the jetting-out unit 5) face the treatment-target object 202. On a side surface of the jetting-out unit 5, the sides that can be regarded as the apices of the cone-shaped members 2, 3 are coupled in ring shapes. In a view point of description with reference to the drawings, at the coupled portion, the jetting-out unit 5 is internally shown in perspective.

On a side surface portion of the jetting-out unit 5, a slit is formed in a ring shape, and, on the slit, the gap do formed by the first cone-shaped member 3 and the second cone-shaped member 2 is coupled. In addition, inside the jetting-out unit 5, a space unit 5H and the jetting-out hole 102 are formed. The space unit 5H is coupled to the ring shaped slit, as well as coupled to the jetting-out hole 102.

Figure 4:
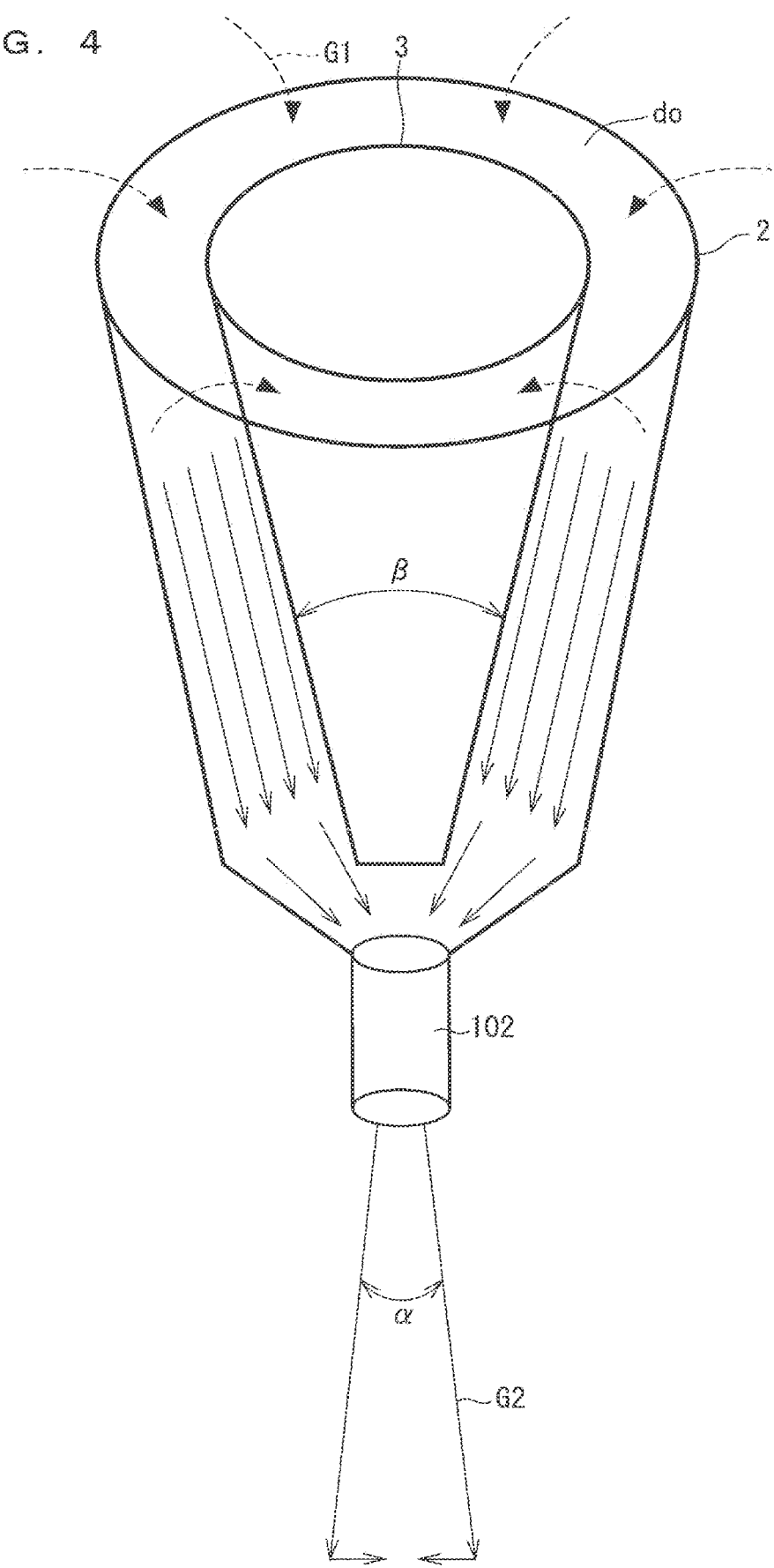
FIG. 4 is a view illustrating a flow of a gas in the gas jetting cell unit 1.

In FIG. 2, a precursor gas G1 or a source gas G1 that can be regarded as a radical gas is supplied, via the gas supply unit 101, into the vessel unit 100D at a predetermined flow rate. And then, with reference to FIGS. 2, 4, with pressure in the vessel unit 100D kept to the desired gas pressure P1, from upper portion sides of the cone-shaped members 2, 3 (i.e. sides to which the jetting-out unit 5 is not provided, or sides that can be regarded as bottom surfaces of cones of the cone-shaped members 2, 3), the gas G1 enters into the gap do. In here, FIG. 4 is a view schematically illustrating flows of the gases G1, G2 in the gas jetting cell unit 1.

The gas G1 passes through the narrow gap do at a length Lxs, and the gas G1 flowed from all around into the gas jetting cell unit 1 is, due to truncated cone shapes of the cone-shaped members 2, 3, rectified in a constant direction of a flow of the gas, and accelerated. The gas is jetted, as the gas G2, from apex sides of the cone-shaped members 2, 3 (i.e. via a jetting-out hole 102 of the jetting-out unit 5) toward the treatment-target object 202 (in other words, jetted into the treatment chamber 200 in which pressure is maintained to the gas pressure P0). In here, as shown in FIG. 4, the gas G2 that is jetted from the gas jetting cell unit 1 forms a beam shape having a beam angle α.

With reference to FIG. 5, a route distance Lx in the gap do is set to at least a value of several ten times of the width $\Delta d$ of the gap do, for example, to a value in a range from 20 mm to 100 mm inclusive. With reference to FIG. 5, even if directions of flows of a gas entering into the gap do of the gas jetting cell unit 1 differ, the directions of the flows of the gas at a peak side of the gas jetting cell unit 1 (i.e. around the jetting-out unit 5) are streamlined and rectified in a direction along the side surfaces of the cone-shaped members 2, 3. In addition, due to the shape of the gas jetting cell unit 1, a cross-sectional area of the ring shaped gap do gradually reduces toward the jetting-out unit 5. Therefore, the gas flowing in the gas jetting cell unit 1 is accelerated (at acceleration a) to the velocity Vs at around the jetting-out unit 5.

With reference to FIG. 5, the gas rectified, accelerated to the velocity Vs, and entered into the jetting-out unit 5 is further compressed and accelerated at the jetting-out hole 102. In here, at the jetting-out hole 102, a pressure difference ΔP (=the gas pressure P1 in the vessel unit 100D−the gas pressure P0 in the treatment chamber 200) is generated, and the pressure difference ΔP is utilized to jet the gas G2 from the jetting-out hole 102 into the treatment chamber 200.

Figure 6:
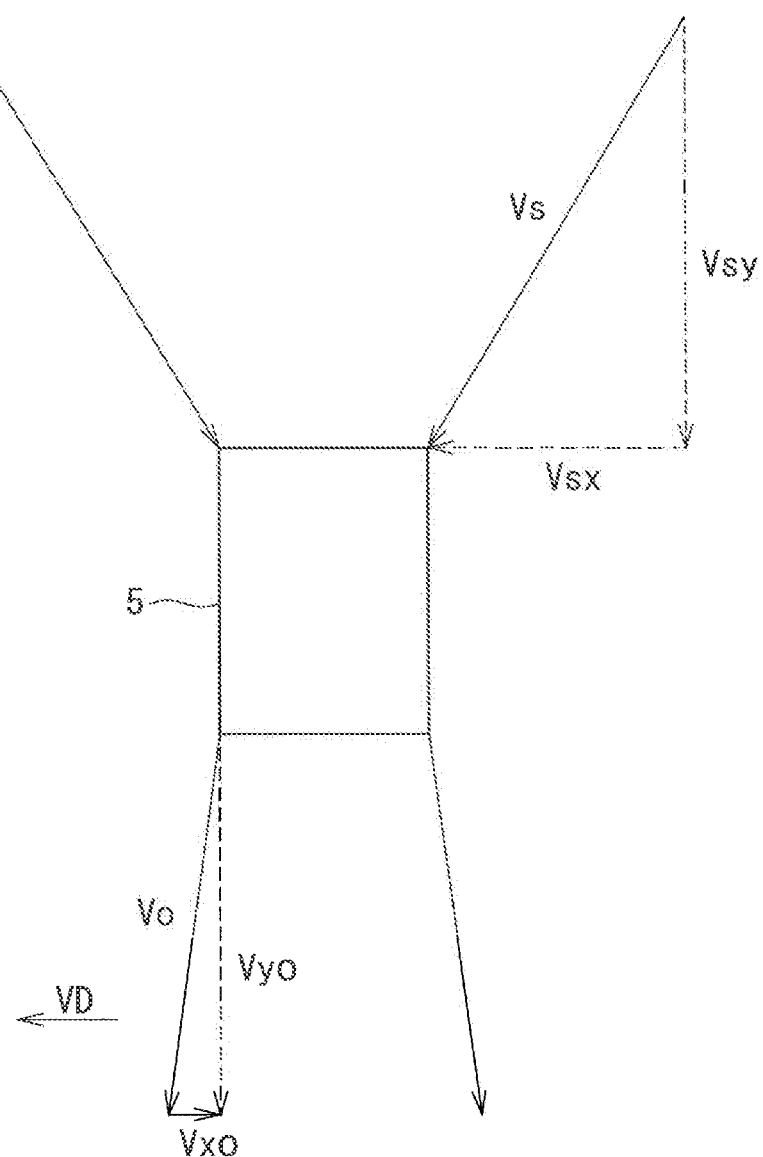
FIG. 6 is a view illustrating how a gas is jetted out from the gas jetting cell unit 1 as a beam having directivity.

In here, with reference to a velocity component diagram shown in FIG. 6, a velocity of a gas entered into the jetting-out unit 5 is specified to Vs, an axial direction component of the velocity Vs is specified to Vsy, and a diameter direction component of the velocity Vs is specified to Vsx. In addition, a velocity of a gas output from the jetting-out unit 5 is specified to V0, an axial direction component of the velocity V0 is specified to Vy0, and a diameter direction component of the velocity V0 is specified to Vx0.

Accordingly, velocity V0={(gas pressure P1)/(gas pressure P0)}×velocity Vs, velocity Vy0={(gas pressure P1)/(gas pressure P0)}×velocity Vsy, and velocity Vx0={(gas pressure P1)/(gas pressure P0)}×velocity Vsx.

Figure 7:
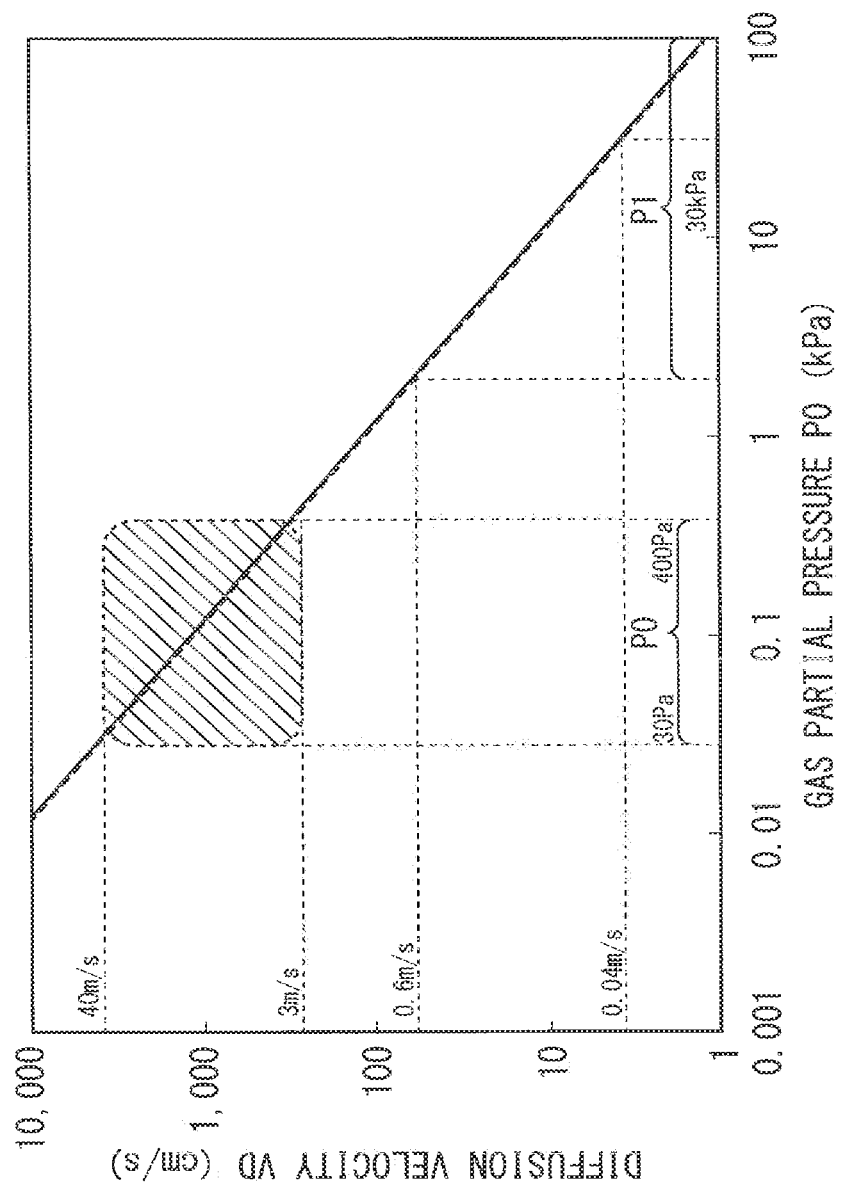
FIG. 7 is a graph illustrating a relationship between gas pressure and a diffusion velocity.

Since pressure in the treatment chamber 200 is pressure close to vacuum pressure (gas pressure P0=approximately 30 Pa to 400 Pa), a diffusion velocity VD of a gas jetted out from the jetting-out unit 5 (see FIG. 6) significantly increases. Incidentally, the velocity Vs of the gas jetted out toward the treatment-target object 202 increases at a cone portion, and, due to the pressure difference between the gas pressure P1 in the vessel unit 100D and the gas pressure P0 in the treatment chamber 200, the gas is jetted out in a beam shape having directivity at a velocity exceeding a supersonic velocity. FIG. 7 is a characteristic diagram illustrating a diffusion velocity VD characteristic at gas pressure P0, when, as a gas species, an oxygen gas or a nitrogen gas is used. With reference to FIG. 7, at the gas jetting cell unit 1, when P1 is specified to 30 kPa, a diffusion velocity VD of the gas is approximately 0.04 m/s, but, at a gas pressure atmosphere P0 in the treatment chamber 200, is a value in a range from 3 m/s to 40 m/s inclusive, thus the diffusion velocity VD of the gas is significantly large. Due to the larger diffusion velocity VD in the treatment chamber, the gas jetting out into the treatment chamber 200 does not have directivity, thus, when a jet out velocity is not higher enough than a diffusion velocity, a gas jetted out into the treatment chamber 200 immediately diffuses in all directions. On the other hand, when a gas G2 is jetted out from the cone-shaped gas jetting cell unit 1 according to the present application invention into the treatment chamber, a jetting-out velocity V0 of the beam-shaped, jetted out gas G2 having directivity reaches a velocity exceeding the supersonic velocity. Therefore, compared with the diffusion velocity VD shown in FIG. 7, the gas has a significantly higher gas flow velocity, thus, while the jetted out gas is prevented as much as possible from being diffused all around, the gas can be jetted at a higher velocity and radiated in a beam shape toward a surface of a treatment-target object.

As for a gas jetted out from the jetting-out unit 5, a gas G2 is jetted out at a velocity exceeding the diffusion velocity VD. Therefore, by allowing the gas G2 to jet from the jetting-out unit 5 so as to have further higher velocities Vsy, Vsx, the gas G2 can be jetted out in a beam shape having directivity from the gas jetting cell unit 1. In addition, since the velocity Vsx has an inward gas velocity vector, due to a cone shape of the gas jetting cell unit, the jetted out gas will also have an effect to have an inward gas velocity vector Vx0, which is a direction toward which a diffusion velocity VD lowers.

In the gas jetting cell unit 1, the gap do has a width Δd of 1 mm, and the gap do has a volume of 50 cm$^3$. In addition, a gas supplied to the gap do of the gas jetting cell unit 1 flows at a flow rate of 1 L (liter)/min. Accordingly, in the gas jetting cell unit 1, acceleration a of the gas that has entered into the jetting-out unit 5 (in FIG. 5, at a position of approximately 0.9 Lx from an inlet of the gap do of the gas jetting cell unit 1) and that has rectified depends on gas pressure P1 in the vessel unit 100D.

Figure 8:
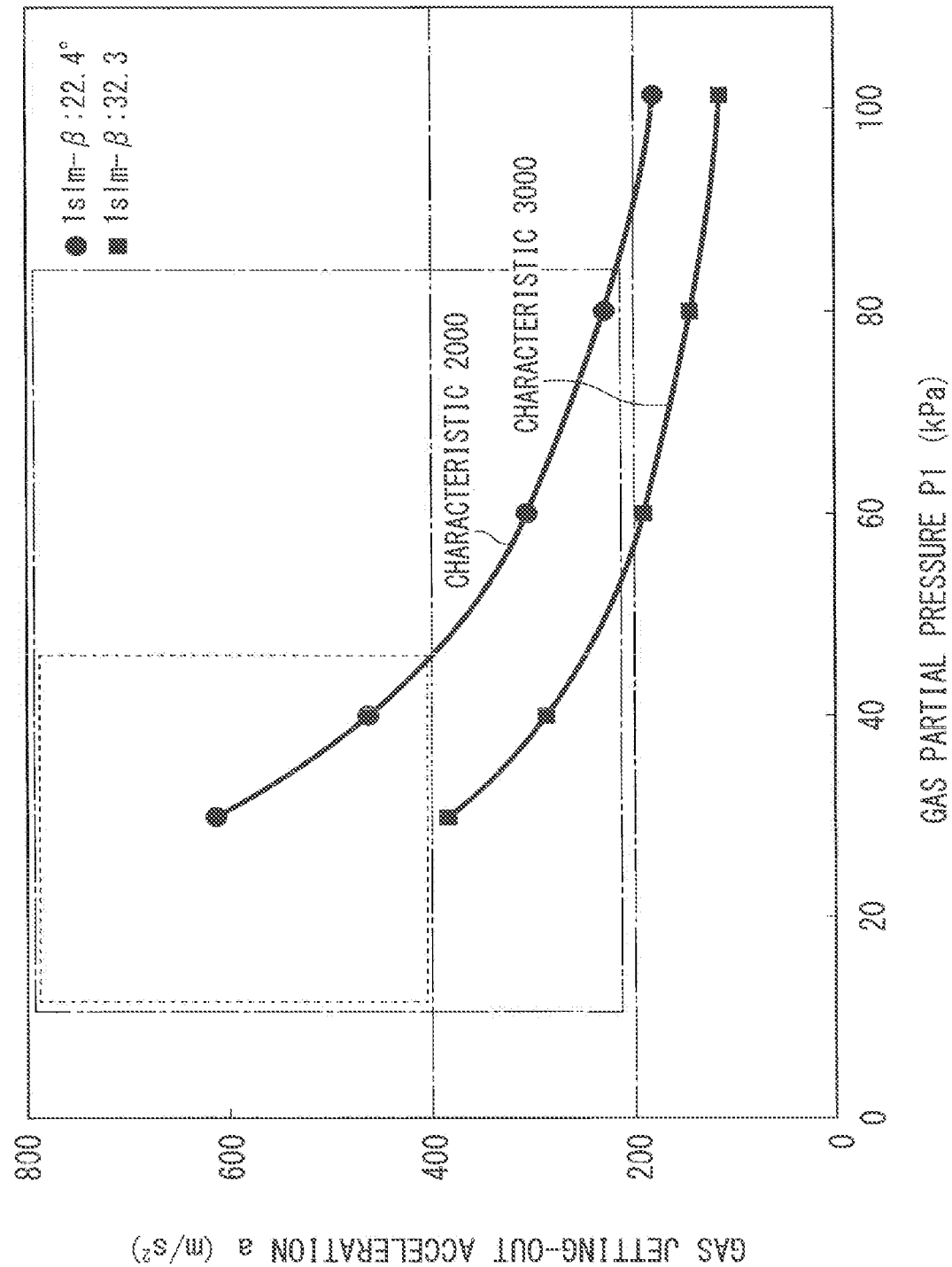
FIG. 8 is a graph illustrating a relationship between gas pressure and gas jetting-out acceleration.

FIG. 8 is a view illustrating a relational characteristic between gas pressure P1 and acceleration a. In FIG. 8, a characteristic 200 represents, when cone angles β of the cone-shaped members 2, 3 (see FIG. 5) are specified to 22.4°, a relational characteristic between gas pressure P1 and acceleration a, while a characteristic 3000 represents, when the cone angles β of the cone-shaped members 2, 3 are specified to 32.3°, a relational characteristic between the gas pressure P1 and the acceleration a.

The inventors have found that, as results of experiments and simulations, when gas pressure P0 in the treatment chamber 200 is set to an appropriate film formation value in a range from approximately 30 Pa to 400 Pa inclusive, in a view point of directivity of a gas G2, an advantageous acceleration of the gas at around the jetting-out unit 5 is at least approximately 200 m/s$^2$. In addition, to jet out a further high quality gas G2 in a beam shape, an advantageous acceleration of the gas G2 is at least approximately 400 m/s$^2$.

Therefore, the inventors have found that, in the gas jetting cell unit 1 with which the above described cone angle is set to a value in a range from around approximately 20° to 40°, in a view point of securing the above described acceleration, advantageous gas pressure P1 in the vessel unit 100D (in the gas jetting cell unit 1) is a maximum of approximately 80 kPa, and, to jet out a further high quality gas G2 in a beam shape, further advantageous gas pressure P1 is a maximum of approximately 50 kPa.

On the other hand, it is advantageous that a pressure loss of at least several ten times of gas pressure P0 (30 Pa to 400 Pa) in the treatment chamber 200 is maintained. In the jetting-out unit 5, when a diameter of the jetting-out hole 102 is specified to a value in a range from 0.03 mm to 1 mm inclusive, while a length L1 of the jetting-out unit 5 is specified to at least 5 mm, advantageous gas pressure P1 in the vessel unit 100D (in the gas jetting cell unit 1) is approximately 20 kPa.

To jet out a high quality gas in a beam shape, in FIG. 5, it is advantageous that, by expanding a cone-shaped portion to rectify a flow of the gas to jet out the rectified gas, a size of the jetting-out unit 5 (diameter D1 and length L1) is designed to as small as possible.

As described above, the gas jetting apparatus 100 according to this exemplary embodiment includes the gas jetting cell unit 1 configured to include the cone-shaped (cone or polygonal cone) members 2, 3.

Therefore, when a length of the cone-shape of the gas jetting cell unit 1 is Lx (when the length Lx is longer enough, compared with a width of the gap do), at a portion of the gap do, a flow of a gas is rectified and accelerated. Therefore, a gas G2 can be jetted in a beam shape having directivity from the gas jetting cell unit 1. Therefore, the gas jetting apparatus 100 can uniformly jet, even onto a treatment-target object having a high-aspect-ratio groove, the gas into the groove, and, as a result, the gas can reach into the groove to uniformly form a film. Although an effect has been described when the gas jetting cell unit 1 is a cone, even when a cone-shape is a polygonal cone, an effect almost identical to the effect of the cone shape can be expected. By having the gas jetting cell unit 1 configured to include the cone-shaped (cone or polygonal cone) members 2, 3, a gas G2 can be jetted out in a beam shape.

In addition, when a length of the cone shape of the gas jetting cell unit 1 is Lx, at the portion of the gap do, a gas can be rectified and accelerated, and, as a result, the gas jetting cell unit 1 can jet a gas G2 at a higher velocity. Therefore, for example, since, even when a gas G2 is a gas containing a shorter life radical gas, the gas can reach a treatment-target object in a shorter period of time, while the high density radical is kept, the radical gas G2 can be radiated toward the treatment-target object 202. Therefore, on the treatment-target object 202, a high quality film can be formed, and, in addition, a film formation temperature can be lowered.

By configuring a gas jetting cell unit 1 with cone-shaped (cone angle<180°) first and second cone-shaped members 2, 3 to form a gap do with the cone-shaped members 2, 3, and allowing a gas to flow into the gap do, in the gas jetting cell unit 1, the gas can be rectified (a velocity is generated in a direction cancelling a diffusion velocity VD) and accelerated (the gas G2 jetted at a higher velocity). Therefore, from the gas jetting cell unit 1, the above described gas G2 having directivity is jetted.

On the other hand, if a cone angle β is too large, many gas collisions occur in the gap do, thus, when generating a radical gas in the gap do, the radical gas greatly disappears in the gap do. In addition, if a cone angle β is too large, an occupation area of the gas jetting cell unit 1 increases. By taking into account these problems, an advantageous maximum cone angle is 60°.

As described above, instead of the conical first and second cone-shaped members 2, 3, polygonal cone-shaped first and second cone-shaped members can be adopted to obtain an effect identical to the above described effect. Although the subsequent exemplary embodiments describe cases when the cone-shaped members 2, 3 are conical, in the exemplary embodiments described below, shapes of the cone-shaped members 2, 3 may obviously be polygonal cone shapes.

In addition, as long as a width Δd of the gap do falls within a range from 0.3 mm to 3 mm inclusive, a rectification in the gas jetting cell unit 1 can fully be achieved. However, the smaller a width Δd of the gap do is, the more a rectification can be improved, thus the gas jetting cell unit 1 can jet a gas G2 at a higher velocity.

In addition, as described above, it is advantageous that portions of the cone-shaped members 2, 3, which face the gap do, are made of sapphire or quartz with which a radical gas is less likely to disappear due to collisions with walls, and that route surfaces are surfaces with less unevenness as much as possible.

Therefore, corroded and other materials due to a gas are less likely to generate on wall surfaces of a gap do into which the gas passes through. Therefore, impurities should be prevented from being output, excluding a gas G2, from the gas jetting cell unit 1. That is, the gas jetting cell unit 1 can always jet out the high purity gas G2.

Second Exemplary Embodiment

Figure 9:
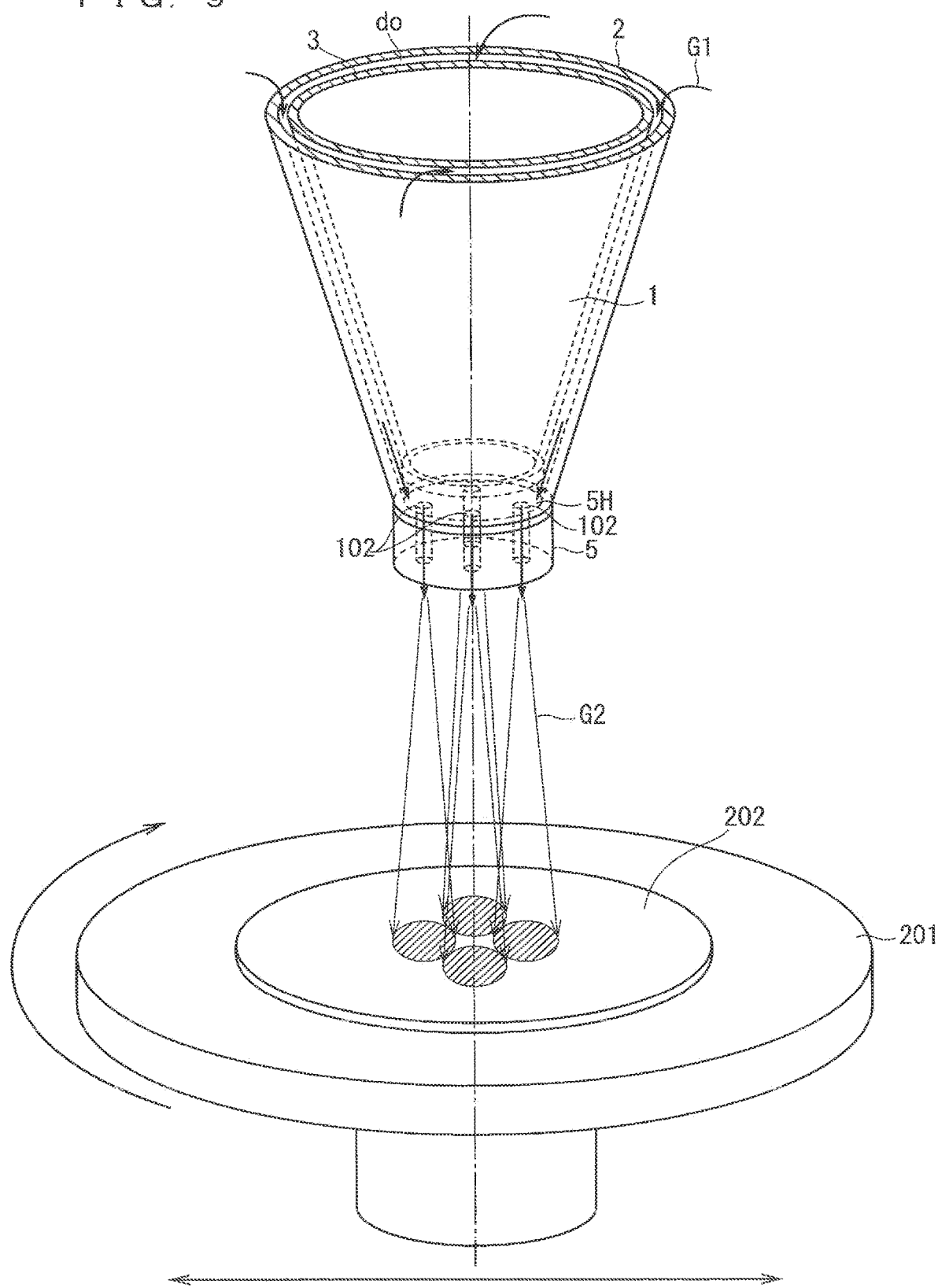
FIG. 9 is a perspective view schematically illustrating a configuration of a gas jetting cell unit 1 according to a second exemplary embodiment.

FIG. 9 is a perspective view schematically illustrating a configuration of a remote plasma type film formation treatment system configured to include a gas jetting apparatus and a treatment chamber according to this exemplary embodiment. In FIG. 9, in order to provide a simplified drawing, a configuration of a vessel unit, a housing and a flange 22 of the treatment chamber 200, and other components are omitted.

Although some members are omitted, the configuration shown in FIG. 2 and the configuration shown in FIG. 9 are identical configurations excluding points described below. That is, although, in the configuration shown in FIG. 2, the jetting-out unit 5 is formed with the single jetting-out hole 102, in the configuration shown in FIG. 9, a jetting-out unit 5 is formed with a plurality of jetting-out holes 102.

In this exemplary embodiment, a gas G1 supplied from a gas supply unit and filled in the vessel unit enters into a gap do of a gas jetting cell unit 1. The gas G1 passes through the gap do, and is supplied to a space unit 5H in the jetting-out unit 5. Via the plurality of jetting-out ports 102, the gas G2 is jetted toward a treatment-target object 202. In here, as also described in the first exemplary embodiment, the jetting-out holes 102 jet out the gas G2 in a beam shape having directivity.

As described above, the gas jetting apparatus according to this exemplary embodiment is formed with, on the single gas jetting cell unit 1, the plurality of jetting-out holes 102.

Therefore, the single gas jetting cell unit 1 can output the gas G2 into a larger area. That is, an area, onto which the gas G2 is radiated, of the treatment-target object 202 increases, compared with the first exemplary embodiment. Therefore, a film can be formed in a further wider area on the treatment-target object 202.

As shown in FIG. 9, by allowing a table 201 to move in a horizontal direction and/or to rotate, even onto a treatment-target object 202 having a larger area, a gas G2 can be radiated onto the treatment-target object 202 entirely.

Third Exemplary Embodiment

In this exemplary embodiment, in a gas jetting cell unit 1, by heating a gas G1, the gas G1 is served as a radical gas. The gas jetting cell unit 1 according to this exemplary embodiment jets the radical gas G2.

A gas species to be heated to generate a radical gas G2 may be an ozone gas (i.e. in FIG. 2, a gas G1 supplied from the gas supply unit 101 to the vessel unit 100D is an ozone gas).

Generally, in an ozone generator, dielectric barrier discharge is used to generate an ozone gas. Recently, a technology for forming an oxide film using an ozone gas by supplying a high density ozonized gas, without including a nitrogen gas, in an amount of approximately 400 g/m$^3$ to a CVD apparatus has already been established.

With such a film formation technology, for example, a reduced pressure atmosphere and a heated atmosphere are required inside the CVD apparatus. Into the CVD apparatus, a precursor gas (for example, a silicon organic compound such as TEOS (Tetraetheylorthosilicate)) and a high density ozone gas are alternatively supplied to form an oxide film onto a treatment-target object in the CVD apparatus.

In here, in a process for supplying the precursor gas, metallic Si is thermally dissociated from the silicon organic compound, and, in a process for supplying the ozone gas, the ozone gas is partially thermally dissociated to generate oxygen atoms (an oxygen radical). The oxygen radical has higher oxidizability, and, through an oxidation reaction with thermally dissociated metallic Si, forms a $SiO_2$ film onto the treatment-target object.

The gas jetting cell unit 1 according to this exemplary embodiment generates, from the ozone gas, an oxygen radical gas, and jets out the oxygen radical gas as a gas G2 in a beam shape having directivity. A configuration of the gas jetting cell unit 1 according to this exemplary embodiment is shown in FIG. 10.

The gas jetting cell unit 1 described in the first exemplary embodiment and the gas jetting cell unit 1 according to this exemplary embodiment have identical configurations excluding that members described below are added.

Figure 10:
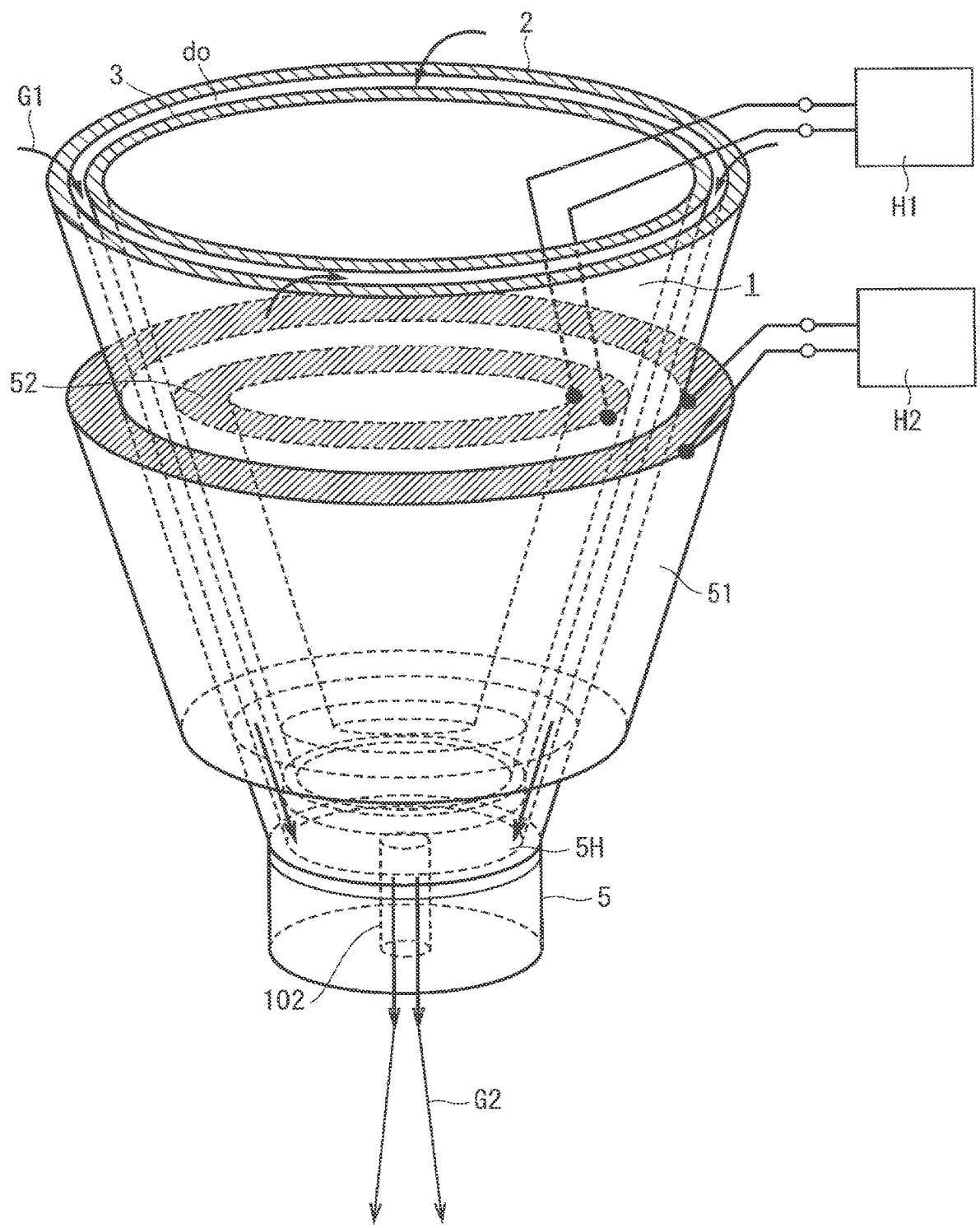
FIG. 10 is a perspective view schematically illustrating a configuration of a gas jetting cell unit 1 according to a third exemplary embodiment.

As shown in FIG. 10, in the gas jetting cell unit 1 according to this exemplary embodiment, on an outer side surface of a second cone-shaped member 2 (i.e. a side surface that does not face a gap do), a heater (heating unit) 51 is provided in a ring shape. In addition, on an inner side surface of a first cone-shaped member 3 (i.e. a side surface that does not face the gap do), a heater (heating unit) 52 is provided in a ring shape.

In this exemplary embodiment, as shown in FIG. 10, the gas jetting apparatus includes a power supply 112 for heating the heater 51 and a power supply H1 for heating the heater 52.

By heating the heaters 51, 52, the cone-shaped members 2, 3 are heated to a temperature in a range from approximately several ten ° C. to 100° C. inclusive, and, as a result, the gap do of the gas jetting cell unit 1 is internally heated to a temperature in a range from several ten ° C. to 100° C. inclusive. When the ozone gas passes through the heated gap do, the ozone gas thermally dissociates, an oxygen radical gas is generated, and, in a short period of time of a life of the oxygen radical gas before the oxygen radical gas returns to an oxygen gas, a gas G2 containing the oxygen radical gas is jetted onto a treatment-target object 202.

The high density ozone gas G1 supplied from the gas supply unit and filled in the vessel unit enters into the gap do of the gas jetting cell unit 1. Inside the gap do heated to a temperature in a range from approximately several ten ° C. to 100° C. inclusive, the ozone gas G1 transmits. The ozone gas being transmitted in the gap do partially thermally dissociates. That is, in the heated gap do, the oxygen radical gas is generated. The oxygen radical gas is supplied to a space unit 5H in a jetting-out unit 5. Via a jetting-out hole 102, the oxygen radical gas G2 is jetted toward the treatment-target object 202. In here, as also described in the first exemplary embodiment, from the jetting-out hole 102, the oxygen radical gas G2 is jetted out in a beam shape having directivity.

Although, in the above description, the configuration with the single jetting-out hole 102 is exemplified, as described in the second exemplary embodiment, for a gas jetting cell unit 1 including a plurality of jetting-out holes 102, heaters 51, 52 may be provided as well.

As described above, in this exemplary embodiment, the cone-shaped members 2, 3 include the heaters 51, 52 for heating.

As described above, since the narrow gap do can internally and directly be heated with the heaters 51, 52, at a lower temperature (in a range from approximately several ten ° C. to 100° C.), an ozone gas is allowed to thermally dissociate in the gap do. The generated oxygen radical gas G2 can be radiated, as a beam having directivity, onto a treatment-target object.

As a gas G1, instead of the ozone gas, a nitrogen compound gas or a hydrogen compound gas may be adopted. In these cases, in the heated gap do, through thermal dissociation, a nitrogen radical gas or a hydrogen radical gas is generated. When a nitrogen radical gas G2 is radiated from the gas jetting cell unit 1 toward the treatment-target object, a nitride film is formed, while, when a hydrogen radical gas G2 is radiated, a hydrogen reduction film (a metallic film in which hydrogen bonding is facilitated) is formed.

In addition, in the gap do of the gas jetting cell unit 1 shown in FIG. 10, as a gas G1, a precursor gas may be allowed to enter. In this case, a heated precursor gas is jetted out in a beam shape from the gas jetting cell unit 1.

Fourth Exemplary Embodiment

In a gas jetting cell unit 1 according to this exemplary embodiment, in a gap do, dielectric barrier discharge is generated, and, the dielectric barrier discharge is used to generate a high quality radical gas. The gas jetting cell unit 1 according to this exemplary embodiment jets out the radical gas in a beam shape having directivity at a higher velocity.

Applying a higher AC voltage onto an electrode surface to generate dielectric barrier discharge, and then, utilizing the dielectric barrier discharge to allow a gas to dissociate to generate a radical gas is widely known. The gas jetting cell unit 1 according to this exemplary embodiment can be utilized as effective means capable of generating, through dielectric barrier discharge, and obtaining a high quality radical gas having significantly higher energy.

In the gas jetting cell unit 1 according to this exemplary embodiment, cone-shaped members 2, 3 are dielectrics, and are made of, for example, sapphire or quartz.

Figure 11:
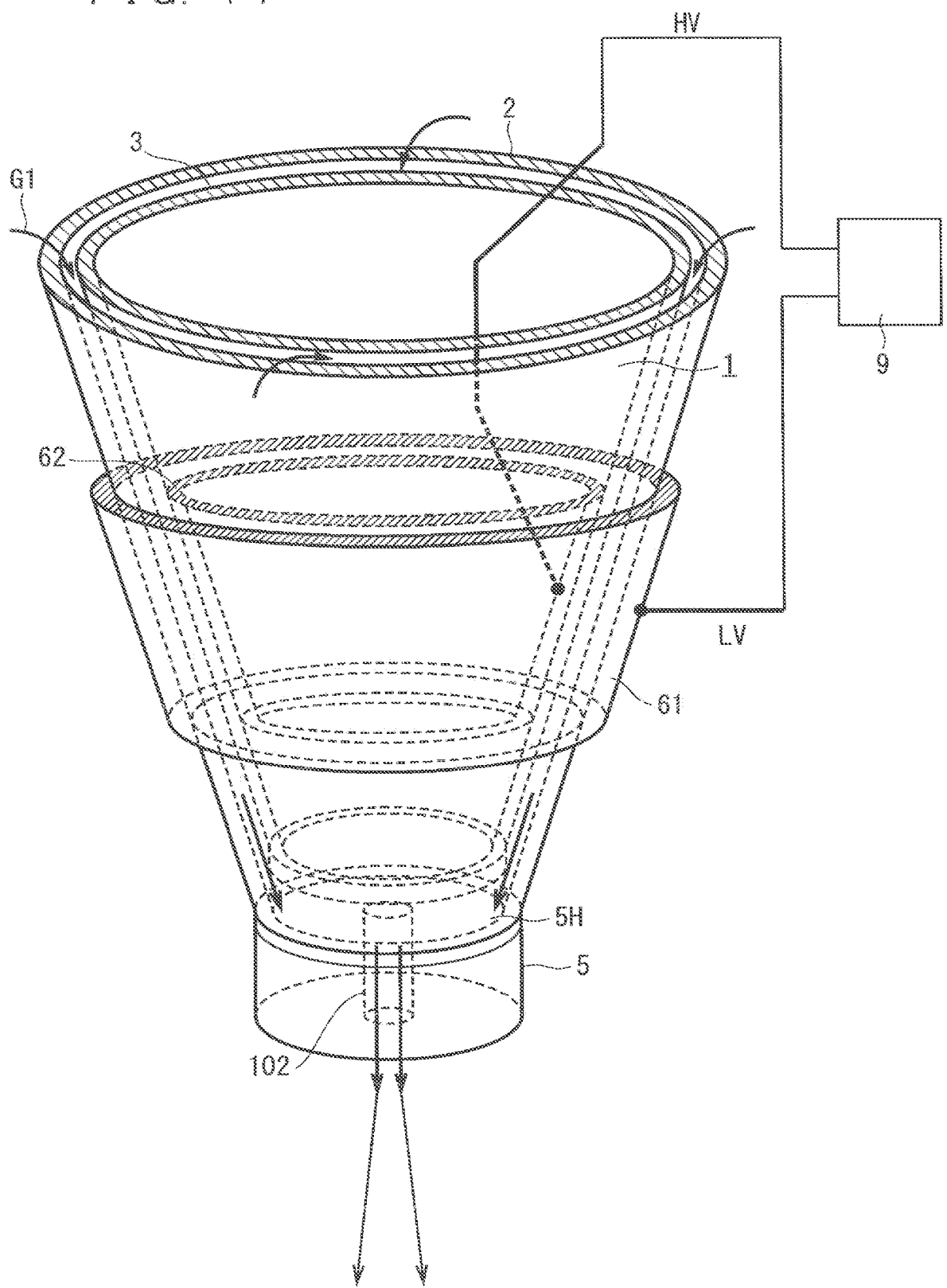
FIG. 11 is a perspective view schematically illustrating a configuration of a gas jetting cell unit 1 according to a fourth exemplary embodiment.

As shown in FIG. 11, in the gas jetting cell unit 1 according to this exemplary embodiment, on an outer side surface of a second cone-shaped member 2 (i.e. a side surface that does not face the gap do), a second electrode unit 61 is provided in a ring shape. In addition, on an inner side surface of a first cone-shaped member 3 (i.e. a side surface that does not face the gap do), a first electrode unit 62 is provided in a ring shape.

In this exemplary embodiment, as shown in FIG. 11, a gas jetting apparatus includes an AC power supply 9 for applying an AC voltage between the first electrode unit 62 and the second electrode unit 61. In here, the first electrode unit 62 is a high potential HV side, while the second electrode unit 61 is a low potential (ground potential) LV side.

The AC power supply 9 applies a higher AC voltage between the second electrode unit 61 and the first electrode unit 62. And then, in a gap do formed between the first cone-shaped member 2 and the second cone-shaped member 3 (which can be regarded as a discharge space), dielectric barrier discharge is generated. When a gas passes through the gap do in which the dielectric barrier discharge is generated, the gas electrolytic-dissociates to generate a high quality radical gas having significantly higher energy. In here, in this exemplary embodiment, the gap do is a high electrical field, and is cold.

In here, a nitrogen gas G1, for example, is supplied from the gas supply unit, and the gas is filled in the vessel unit. And then, the nitrogen gas G1 enters into the gap do of the gas jetting cell unit 1. Inside the gap do in which dielectric barrier discharge is generated, the nitrogen gas G1 transmits. Through the dielectric barrier discharge, from the nitrogen gas being transmitted in the gap do, a nitrogen radical gas is generated. The nitrogen radical gas is supplied to a space unit 5H in the jetting-out unit 5. Via a jetting-out hole 102, the nitrogen radical gas G2 is jetted toward a treatment-target object 202. In here, as also described in the first exemplary embodiment, the jetting-out hole 102 jets out the nitrogen radical gas G2 in a beam shape having directivity at a higher velocity.

Although, in the above description, the configuration with the single jetting-out hole 102 is exemplified, as described in the second exemplary embodiment, for a gas jetting cell unit 1 including a plurality of jetting-out holes 102, electrode units 61, 62 may be provided as well.

As described above, in this exemplary embodiment, the cone-shaped members 2, 3 include the electrode units 61, 62.

Therefore, in the gap do of the gas jetting cell unit 1, dielectric barrier discharge can be generated. Therefore, when a gas G1 is supplied into the gap do, a radical gas can be generated in the gap do. From the gas jetting cell unit 1, the radical gas G2 is output in a beam shape having directivity. In here, as also described in the first exemplary embodiment, the gas transmitted in the gap do is rectified and accelerated. Therefore, the gas jetting cell unit 1 outputs the beamed radical gas G2 at a higher velocity. Therefore, a time required by the radical gas G2 to reach a treatment-target object is shortened, and, while its high density is maintained, the radical gas G2 is radiated onto the treatment-target object.

In here, to remove discharge heat generated through dielectric barrier discharge, although not shown, the electrode units 61, 62 may internally be provided with flow channels into which a refrigerant circulates. By allowing a refrigerant such as water to circulate in the flow channels, the electrode units 61, 62, the cone-shaped members 2, 3, and the gap do can be cooled. In the cooled gap do, a further high quality radical gas is generated.

To use dielectric barrier discharge to generate a high quality radical gas, a plasma state in the gap do should be a higher electrical field. To achieve a plasma state in a higher electrical field, a product of P·d (kPa·cm) is required to satisfy a condition of a predetermined value or lower. In here, P represents gas pressure in the gap do (which can be regarded as gas, pressure P1 described above), while d represents a width of the gap do (which can be regarded as Δd described above).

In a case of a radical gas, if a product of P·d results in an identical value, between a condition of atmospheric pressure+shorter gap length (smaller width Δd) (referred to as a former) and a condition of decompression+longer gap length (larger width Δd) (referred to as a latter), the latter is advantageous in terms of points shown below. That is, in the case of the latter, a flow velocity of a gas flowing into the gap do can be increased, and a gap length (a wall of a discharge surface) extends, thus a loss due to an amount of collisions of a radical gas onto the wall can be reduced (i.e. decomposition in the generated radical gas amount (radical gas density) can be reduced).

As described above, in a view point of stably driving dielectric barrier discharge to obtain a fine radical gas, the inventors have found that the gas jetting cell unit 1 should advantageously satisfy conditions shown below.

That is, in the radical gas generating apparatus 100, it is advantageous that gas pressure P1 inside the gas jetting apparatus (in other words, in the gap do) is set to a value in a range from approximately 10 kPa to 30 kPa inclusive, and a width Δd of the gap do is set to a value in a range from approximately 0.3 to 3 mm inclusive, to obtain a value of a product of P·d in a range from approximately 0.3 to 9 (kPa·cm) inclusive. By setting the gas pressure P1 and the width Δd in the ranges of the values, a field intensity of dielectric barrier discharge can be increased to generate a high quality radical gas.

In the above description, as an example, a case where, as a gas G1, a nitrogen gas is adopted is described. However, instead of a nitrogen gas, a nitrogen compound gas may be adopted. In addition, as a gas G1 to be supplied to the gap do of the gas jetting cell unit 1, an oxygen compound gas (including an oxygen gas and ozone), a hydrogen compound gas (including a hydrogen gas), and another similar gas may be adopted. In this case, in the gap do, due to electrolytic dissociation, an oxygen radical gas is generated from the oxygen compound gas, while a hydrogen radical gas is generated from the hydrogen compound gas.

When an oxygen radical gas G2 is radiated from the gas jetting cell unit 1 toward the treatment-target object, an oxide film is formed, while, when a hydrogen radical gas G2 is radiated, a hydrogen reduction film (a metallic film in which hydrogen bonding is facilitated) is formed.

Fifth Exemplary Embodiment

In this exemplary embodiment, a plurality of the above described gas jetting cell units is provided in a gas jetting apparatus. In addition, in this exemplary embodiment, a batch type treatment chamber is adopted. That is, in the treatment chamber, a plurality of treatment-target objects is disposed. In addition, although, in the single gas jetting apparatus, the plurality of gas jetting cell units is provided, the plurality of gas jetting cell units and the plurality of treatment-target objects are respectively in a one-to-one relationship. That is, each of the plurality of the gas jetting-out cell units provided in the single gas jetting apparatus jets out a gas toward each of the plurality of the treatment-target objects.

Figure 12:
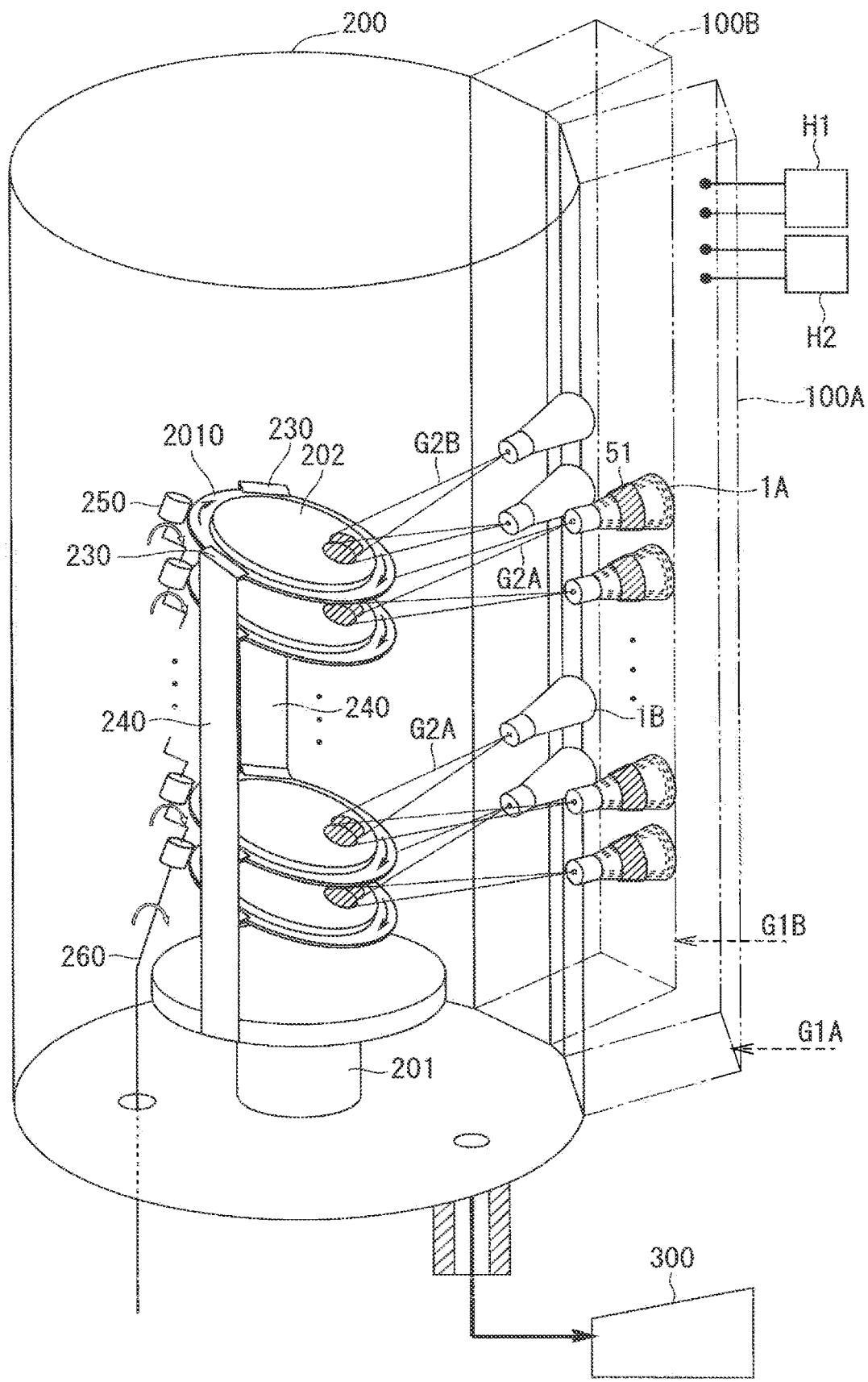
FIG. 12 is a perspective view schematically illustrating a configuration of a remote plasma type film formation treatment system where a batch type treatment chamber 200 is provided with a plurality of gas jetting cell units 1A, 1B.

FIG. 12 is a perspective view schematically illustrating a configuration of a remote plasma type film formation treatment system configured to include gas jetting apparatuses 100A, 100B and a treatment chamber 200 according to this exemplary embodiment.

As shown in FIG. 12, in this exemplary embodiment, in the treatment chamber 200, a plurality of treatment-target objects 202 is disposed in a multi-stage manner in a vertical direction. That is, the treatment chamber 200 according to this exemplary embodiment is a batch type CVD apparatus.

On a side surface portion of the treatment chamber 200, the first gas jetting apparatus 100A and the second gas jetting apparatus 100B are coupled. Specifically, the treatment chamber 200 and the first gas jetting apparatus 100A are coupled via a vacuum flange. Similarly, the treatment chamber 200 and the second gas jetting apparatus 100B are coupled via a vacuum flange. Gas pressure in the gas jetting apparatuses 100A, 100B is kept constant at predetermined pressure in a range, for example, from 10 kPa to 50 kPa inclusive.

In here, in the first gas jetting apparatus 100A, a plurality of gas jetting cell units 1A for jetting a radical gas is provided. In addition, in the second gas jetting apparatus 100B, a plurality of gas jetting cell units 1B for jetting a precursor gas is provided.

Configurations of the gas jetting cell units 1A, 1B are identical to a content described in the first exemplary embodiment or the second exemplary embodiment. In addition, the gas jetting cell units 1A also have technological features described in the third exemplary embodiment, that is, heaters 51, 52 for heating cone-shaped members 2, 3 (in FIG. 12, the heater 51, a power supply H2 for heating the heater 51, and a power supply H1 for heating the heater 52 are shown).

As described above, in the treatment chamber 200, treatment-target objects 202 are disposed in a multi-stage manner in a vertical direction. Similarly, in the first gas jetting apparatus 100A, the plurality of gas jetting cell units 1A are disposed in a line in a vertical direction. Similarly, in the second gas jetting apparatus 100B, the plurality of gas jetting cell units 1B are disposed in a line in a vertical direction.

In addition, in the first gas jetting apparatus 100A, a source gas G1A is supplied for radicalization through heating. In the second gas jetting apparatus 100B, a precursor gas G1B is supplied.

The gas jetting cell unit 1A at an uppermost stage (first stage) radiates a radical gas G2A toward the treatment-target object 202 at an uppermost stage (first stage), while the gas jetting cell unit 1B at an uppermost stage (first stage) radiates a precursor gas G2B toward the treatment-target object 202 at the uppermost stage (first stage).

Similarly, the gas jetting cell unit 1A at a second stage from top radiates the radical gas G2A toward the treatment-target object 202 at the second stage from top, while the gas jetting cell unit 1B at a second stage from top radiates the precursor gas G2B toward the treatment-target object 202 at a second stage from top.

Similarly, the gas jetting cell unit 1A at an n-th stage from top radiates the radical gas G2A toward the treatment-target object 202 at an n-th stage from top, while the gas jetting cell unit 1B at an n-th stage from top radiates the precursor gas G2B toward the treatment-target object 202 at the n-th stage from top.

The gas jetting cell unit 1A at a lowermost stage radiates the radical gas G2A toward the treatment-target object 202 at a lowermost stage, while the gas jetting cell unit 1B at a lowermost stage radiates the precursor gas G2B toward the treatment-target object 202 at the lowermost stage.

As shown in FIG. 12, in the treatment chamber 200, on a table 201, two pillars 240 extend in a vertical direction. In addition, along an extending direction of the pillars 240, loading stands 2010 are provided in a vertical direction. In here, the pillars 240 are each attached with support units 230, and, by the support units 230 and members (not shown), the loading stands 2010 are rotatably supported.

In here, as shown in FIG. 12, on the loading stands 2010, treatment-target objects 202 are each loaded. In addition, in order to allow the treatment-target objects 202 to face in a gas jetting-out direction from the gas jetting cell units 1A, 1B, the loading stands 2010 are each obliquely supported by the support units 230 and the members (not shown).

Side surface portions of the loading stands 2010 each abut with the rotating rollers 250. Therefore, by allowing the rotating rollers to rotate, the loading stands 2010 can rotate. The rotating rollers 250 join to shaft clamps 260. By allowing the shaft clamps 260 to axially rotate, the rotating rollers 250 (as a result, the loading stands 2010) can rotate at a constant cycle.

As also described in the first exemplary embodiment, inside the treatment chamber 200, air is evacuated by a vacuum pump 300, and, after film formation, a gas is evacuated from the treatment chamber 200 so that pressure in the treatment chamber 200 is kept to a reduced pressure atmosphere appropriate for film formation. Generally, the treatment chamber 200 is internally set to a fixed condition at pressure in a range from approximately 30 Pa to 400 Pa inclusive.

Although not shown in the drawing, a heater is coupled to a side surface of the treatment chamber 200. By the heater, a temperature in the treatment chamber 200 is controlled to a temperature appropriate for film formation.

With the gases G2A, G2B radiated in a beam shape from the gas jetting cell units 1A, 1B toward the treatment-target objects 202, a desired film is formed on surfaces of the treatment-target objects 202. A pattern of supplying the gases G2A, G2B into the treatment chamber 200 is determined in accordance with a film formation condition, and gas flow rates and ON-OFF of the gases are controlled by a mass flow controller and a pneumatic valve.

As described in the third exemplary embodiment, the gas jetting cell units 1A, jet, for example, an oxygen radical gas G2A generated through thermal dissociation. On the other hand, the gas jetting cell units 1B jet a precursor gas G2B. On the treatment-target objects 202, the oxygen radical gas G2A and the precursor gas G2B chemically react, and, when metal of the precursor gas G2B and oxygen atoms join, a metal oxide substance accumulates on the treatment-target objects 202. Inside the treatment chamber 200, a reduced pressure atmosphere is maintained and heated to a desired temperature. Therefore, the accumulated metal oxide substance diffusion-bonds on the surfaces of the treatment-target objects 202, a crystallized film is formed, and, as a result, a desired metal oxide film is formed on the treatment-target objects 202.

When a film formation treatment is performed, as described above, the loading stands 2010 rotate. In addition, on the treatment-target objects 202, in order to allow the gases G2A, G2B to radiate in further wider areas, in addition to rotation of the loading stands 2010, the loading stands 2010 may repeatedly be moved in a vertical direction (the vertical direction in FIG. 12). Therefore, on the treatment target objects 202, a uniform metal oxide film can entirely be formed in a shorter period of time.

Figure 13:
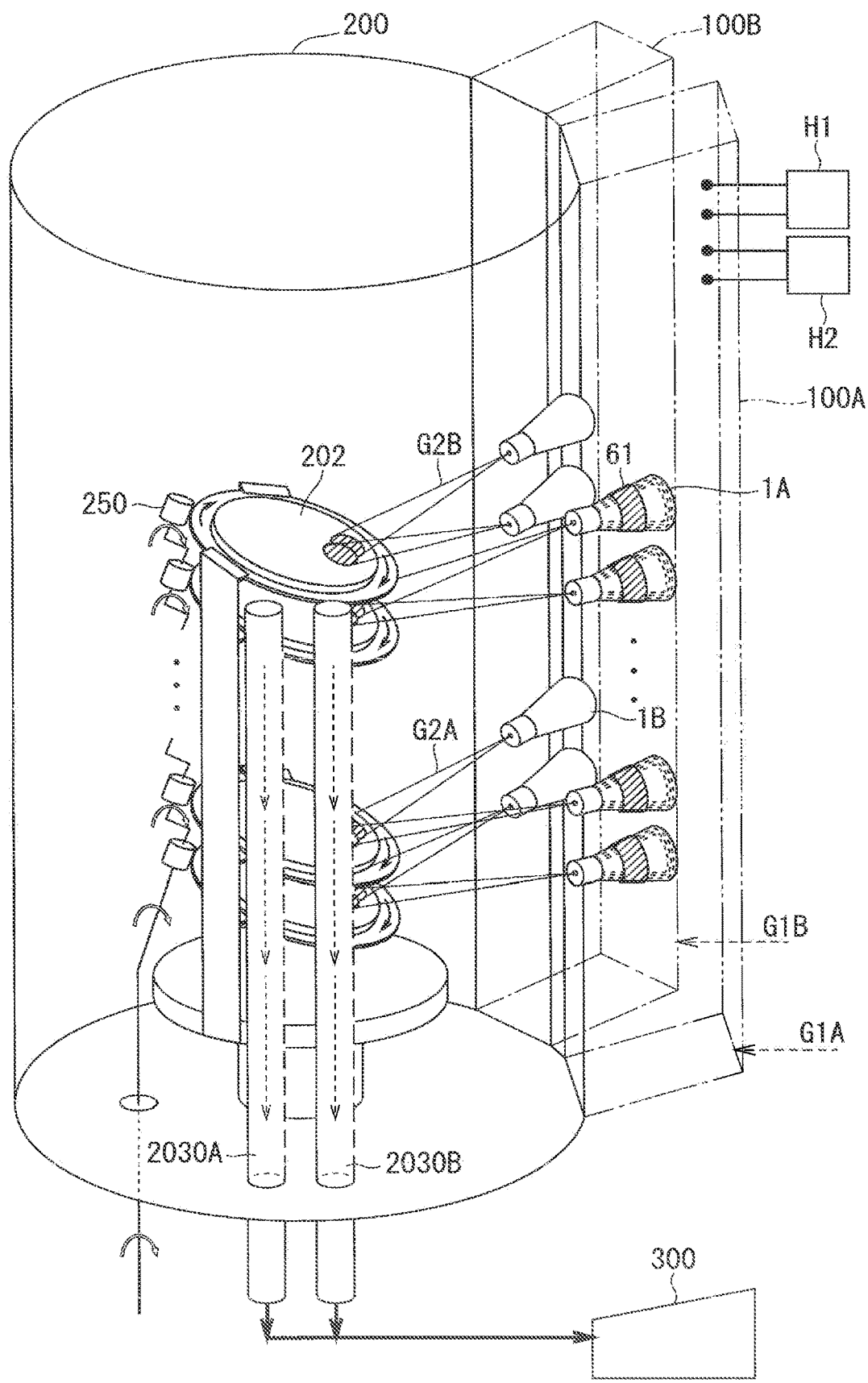
FIG. 13 is a perspective view schematically illustrating another configuration of the remote plasma type film formation treatment system where the batch type treatment chamber 200 is provided with the plurality of gas jetting cell units 1A, 1B.

Instead of the configuration shown in FIG. 12, a configuration shown in FIG. 13 may be adopted. As can be seen from a comparison between FIGS. 12 and 13, in the configuration shown in FIG. 13, gas evacuation pipes 2030A, 2030B are added to the configuration shown in FIG. 12.

As shown in FIG. 13, the gas evacuation pipe 2030A and the gas evacuation pipe 2030B are provided in the treatment chamber 200. In addition, an edge of the gas evacuation pipe 2030A and an edge of the gas evacuation pipe 2030B are coupled to the vacuum pump 300. The gas evacuation pipe 2030A evacuates a radical gas G2A jetted out from the gas jetting cell units 1A and reflected by the treatment-target objects 202. The gas evacuation pipe 2030B evacuates a precursor gas G2B jetted out from the gas jetting cell units 1B and reflected by the treatment-target objects 202.

More specifically, a side surface portion of the gas evacuation pipe 2030A is drilled with a plurality of evacuation holes. That is, the plurality of evacuation holes are each provided so as to correspond to each of the plurality of treatment-target objects 202. Therefore, the evacuation holes of the gas evacuation pipe 2030A evacuate a radical gas G2A jetted out from the gas jetting cell units 1A and reflected by the treatment-target objects 202.

In addition, a side surface portion of the gas evacuation pipe 2030B is drilled with a plurality of evacuation holes. That is, the plurality of evacuation holes are each provided so as to correspond to each of the plurality of treatment-target objects 202. Therefore, the evacuation holes of the gas evacuation pipe 2030B evacuate a radical gas G2B jetted out from the gas jetting cell units 1B and reflected by the treatment-target objects 202.

As shown in FIG. 13, with the provided gas evacuation pipes 2030A, 2030B, flows of gases in the treatment chamber 200 can be kept constant. That is, the gases G2A, G2A reflected by any of the treatment-target objects 202 are prevented from being radiated toward the other treatment-target objects 202. Therefore, on the treatment-target objects 202, a further high quality film can be formed.

As shown in FIGS. 12, 13, in the gas jetting apparatuses 100A, 100B, the plurality of gas jetting cell units 1A, 1B should be provided in a multi-stage manner. Therefore, it is advantageous that occupation areas onto which the gas jetting cell units 1A, 1B are disposed are as small as possible, and cone angles β of the above described gas jetting cell units 1A, 1B are set to 50° in maximum.

As described above, in this exemplary embodiment, the plurality of gas jetting cell units 1A, 1B is provided. The gas jetting cell units 1A for a radical gas radiate a radical gas G2A toward the treatment-target objects 202, while the gas jetting cell units 1B for a precursor gas radiate a precursor gas G2B toward the treatment-target objects 202.

Therefore, in a single film-formation process, a desired film can simultaneously be formed on the plurality of treatment-target objects 202. Although, in this exemplary embodiment, as a shape of the plurality of gas jetting cell units 1A, 1B, a cone shape is described, as another example, a fan-shaped gas spatial profile, a fan-shaped gas heating spatial profile, or a fan-shaped discharge gas spatial profile described later may be applied to jet a gas into a treatment-target chamber.

In the above described example, in the first gas jetting apparatus 100A, the gas jetting cell units described in the third exemplary embodiment are provided. However, in the first gas jetting apparatus 100A, the gas jetting cell units described in the fourth exemplary embodiment may be provided. That is, in the first gas jetting apparatus 100A, a plurality of gas jetting cell units for generating, using dielectric barrier discharge, and jetting out a radical gas may be provided.

Sixth Exemplary Embodiment

In this exemplary embodiment, a plurality of the gas jetting cell units described in the first to fourth exemplary embodiments is provided in a gas jetting apparatus. In addition, in this exemplary embodiment, a sheet-fed type treatment chamber is adopted. That is, in the treatment chamber, a single treatment-target object is disposed. In addition, in the single gas jetting apparatus, a plurality of gas jetting cell units is provided, and all the gas jetting cell units 1 radiate a gas onto the single treatment-target object.

Figure 14:
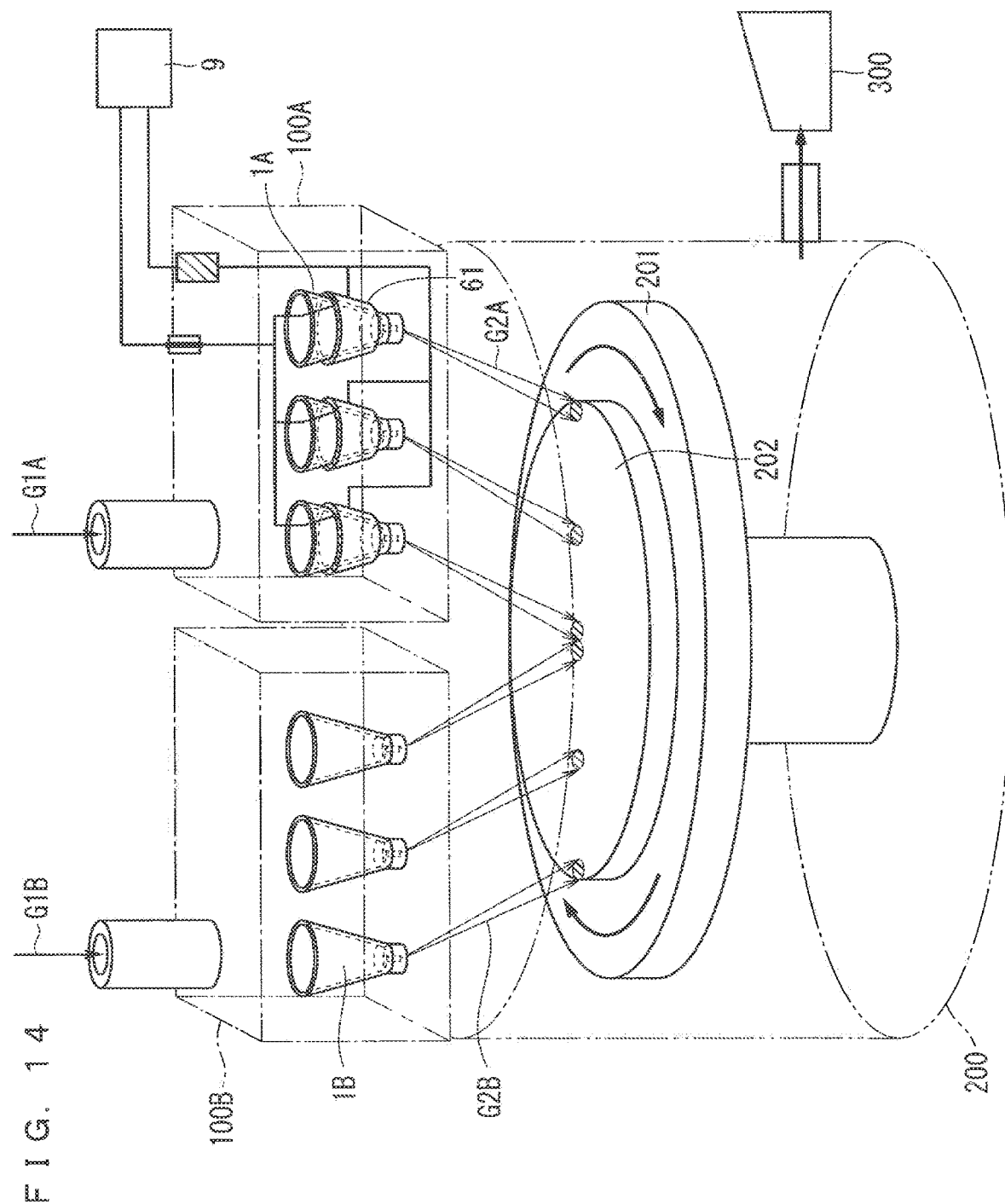
FIG. 14 is a perspective view schematically illustrating a configuration of a remote plasma type film formation treatment system where a sheet-fed type treatment chamber 200 is provided with a plurality of gas jetting cell units 1A, 1B.

FIG. 14 is a perspective view schematically illustrating a configuration of a remote plasma type film formation treatment system configured to include gas jetting apparatuses 100A, 100B and a treatment chamber 200 according to this exemplary embodiment.

As shown in FIG. 14, in this exemplary embodiment, in the treatment chamber 200, the single treatment-target object 202 is disposed (specifically, the single treatment-target object 202 having a large area is loaded on a table 201 provided in the treatment chamber 200). That is, the treatment chamber 200 according to this exemplary embodiment is a sheet-fed type CVD apparatus.

On a top surface portion of the treatment chamber 200, the first gas jetting apparatus 100A and the second gas jetting apparatus 100B are coupled. Specifically, the treatment chamber 200 and the first gas jetting apparatus 100A are coupled via a vacuum flange. Similarly, the treatment chamber 200 and the second gas jetting apparatus 100B are coupled via a vacuum flange. Gas pressure in the gas jetting apparatuses 100A, 100B is kept constant at predetermined pressure in a range, for example, from 10 kPa to 50 kPa inclusive.

In here, in the first gas jetting apparatus 100A, a plurality of gas jetting cell units 1A for jetting a radical gas is provided. In addition, in the second gas jetting apparatus 100B, a plurality of gas jetting cell units 1B for jetting a precursor gas is provided.

Configurations of the gas jetting cell units 1A, 1B are identical to a content described in the first exemplary embodiment or the second exemplary embodiment. In addition, the gas jetting cell units 1A also have technological features described in the fourth exemplary embodiment, that is, electrode units 61, 62 for applying AC voltage between cone-shaped members 2, 3 (in FIG. 14, the electrode unit 61, and an AC power supply 9 for applying an AC voltage between the electrode units 61, 62 are shown).

In addition, in the first gas jetting apparatus 100A, a source gas G1A is supplied as a raw material of a radical gas. In the second gas jetting apparatus 100B, a precursor gas G1B is supplied.

All the gas jetting cell units 1A provided in the first gas jetting apparatus 100A radiate a radical gas G2A toward different areas of the single treatment-target object 202. In addition, all the gas jetting cell units 1B provided in the second gas jetting apparatus 100B radiate a precursor gas G1B toward different areas of the single treatment-target object 202.

A table 201 is rotatable, and, as the table 201 rotates, the treatment-target object 202 also rotates.

As also described in the first exemplary embodiment, inside the treatment chamber 200, air is evacuated by a vacuum pump 300, and, after film formation, a gas is evacuated from the treatment chamber 200 so that pressure in the treatment chamber 200 is kept to a reduced pressure atmosphere appropriate for film formation. Generally, the treatment chamber 200 is internally set to a fixed condition at pressure in a range from approximately 30 Pa to 400 Pa inclusive.

Although not shown in the drawing, a heater is coupled to the table 201. By the heater, a temperature in the treatment chamber 200 is controlled to a temperature appropriate for film formation.

With the gases G2A, G2B radiated in a beam shape from the gas jetting cell units 1A, 1B toward the treatment-target object 202, a desired film is formed on a surface of the treatment-target object 202. A pattern of supplying the gases G2A, G2B into the treatment chamber 200 is determined in accordance with a film formation condition, and gas flow rates and ON-OFF of the gases acre controlled by a mass flow controller and a pneumatic valve.

As described in the fourth exemplary embodiment, the gas jetting cell units 1A, jet, for example, a nitrogen radical gas G2A generated through dielectric barrier discharge. On the other hand, the gas jetting cell units 1B jet a precursor gas G2B. On the treatment-target object 202, the nitrogen radical gas G2A and the precursor gas G2B chemically react, and, when metal of the precursor gas G2B and nitrogen atoms join, a metal nitride substance accumulates on the treatment-target object 202. Inside the treatment chamber 200, a reduced pressure atmosphere is maintained and heated to a desired temperature. Therefore, the accumulated metal nitride substance diffuses, and, as a result, a desired metal nitride film is formed on the treatment-target object 202.

When a film formation treatment is performed, as described above, the table 201 rotates. Therefore, on the treatment-target object 202, a uniform metal oxide film can entirely be formed.

As shown in FIG. 14, in the gas jetting apparatuses 100A, 100B, the plurality of gas jetting cell units 1A, 1B should be provided. Therefore, it is advantageous that occupation areas onto which the gas jetting cell units 1A, 1B are disposed are as small as possible, and cone angles β of the above described gas jetting cell units 1A, 1B are set to 50° in maximum.

As described above, in this exemplary embodiment, the plurality of gas jetting cell units 1A, 1B is provided. All the gas jetting cell units 1A, 1B radiate the gases G2A, G2B toward the single treatment-target object 202.

Therefore, even on a treatment-target object 202 having a larger area, a desired film can be formed in a short period of time.

In the above described example, in the first gas jetting apparatus 100A, the gas jetting cell units described in the fourth exemplary embodiment are provided. However, in the first gas jetting apparatus 100A, the gas jetting cell units described in the third exemplary embodiment may be provided. That is, in the first gas jetting apparatus 100A, a plurality of gas jetting cell units for generating a radical gas through thermal dissociation based on heating by a heater, and jetting out the radical gas may be provided.

Seventh Exemplary Embodiment

This exemplary embodiment describes another shape of the above described gas jetting cell unit 1. The shape of the above described gas jetting cell unit 1 is a cone shape such as a cone or a polygonal cone. In this exemplary embodiment, a shape of a gas jetting cell unit 1 is configured by using two flat plates so as to rectify a direction of a flow of a gas for acceleration.

Figure 15:
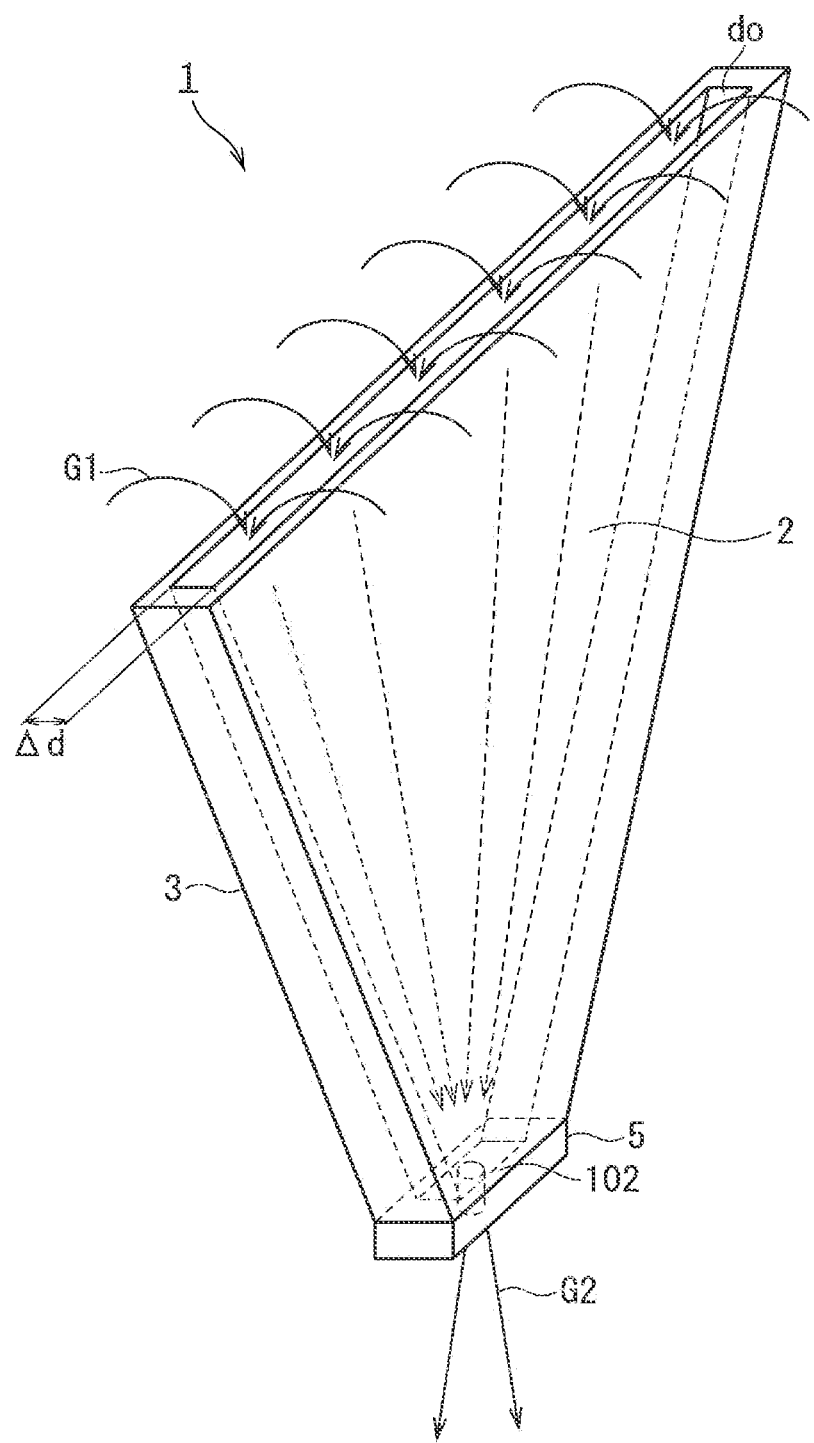
FIG. 15 is a perspective view schematically illustrating a configuration of a gas jetting cell unit 1 according to a seventh exemplary embodiment.

FIG. 15 is a perspective view illustrating a configuration of the gas jetting cell unit 1 according to this exemplary embodiment. As shown in FIG. 15, the gas jetting cell unit 1 is configured to allow two flat plates 2, 3 to face each other, but separated at an interval Δd. Members forming both side surfaces of the gas jetting cell unit 1 function as spacers for forming a gap do between the two flat plates 2, 3, and, by the members, on entire areas inside the gap do, the interval Δd is kept constant. In addition, when surfaces of the flat plates 2, 3 are viewed in plane, a flat shape where a width decreases from a gas inlet (an upper portion side) to a gas outlet (a lower portion side, which can be regarded as an apex side of a fan shape) is provided (hereinafter referred to as a fan shape). Therefore, in the gas jetting cell unit 1, a width on the gas inlet side is wider than a width on a gas outlet side (apex side).

A gas G1 supplied from the above described gas supply unit 101 enters from an opening provided at an upper portion of the gas jetting cell unit 1 into the gas jetting cell unit 1, and then passes through the gap do in the gas jetting cell unit 1. The interval Δd of the gap do is constant in the gas jetting cell unit 1, and the gas G1 flows into the fan-shaped gap do toward a lower portion side. Due to the fan shape, a cross-sectional area in the gap do decreases from a gas entrance side toward the gas outlet side. Therefore, a gas flow velocity increases in the gas jetting cell unit 1.

The gas G1 passed through the gas jetting cell unit 1 passes through jetting-out hole 102 drilled on a jetting-out unit 5 provided at the lower portion side of the gas jetting cell unit 1, and is jetted in a beam shape as a gas G2. That is, the apex side of the fan-shaped gas jetting cell unit 1 (a side provided with the jetting-out unit 5) faces a treatment-target object 202, and the gas G2 passes through the jetting-out hole 102, and is jetted in a beam shape toward the treatment-target object 202. In here, the above described jetting-out hole 102 provided on the jetting-out unit 5 may be one or plural.

The two flat plates 2, 3 and the members served as side surfaces are made of any of alumina, quartz, and sapphire, and integrally configured.

As shown in FIG. 15, with the fan-shaped gas jetting cell unit 1, not only an effect identical to an effect of a cone-shaped gas jetting cell unit 1 is achieved, but also a gas jetting cell unit 1 can be produced at a lower cost. In addition, a fan-shaped gas jetting cell unit 1 is advantageous for lamination and other similar integration methods, than a cone-shaped gas jetting cell unit 1, because many fan-shaped gas jetting cell units 1 can be provided in a narrower area.

Eighth Exemplary Embodiment

Figure 16:
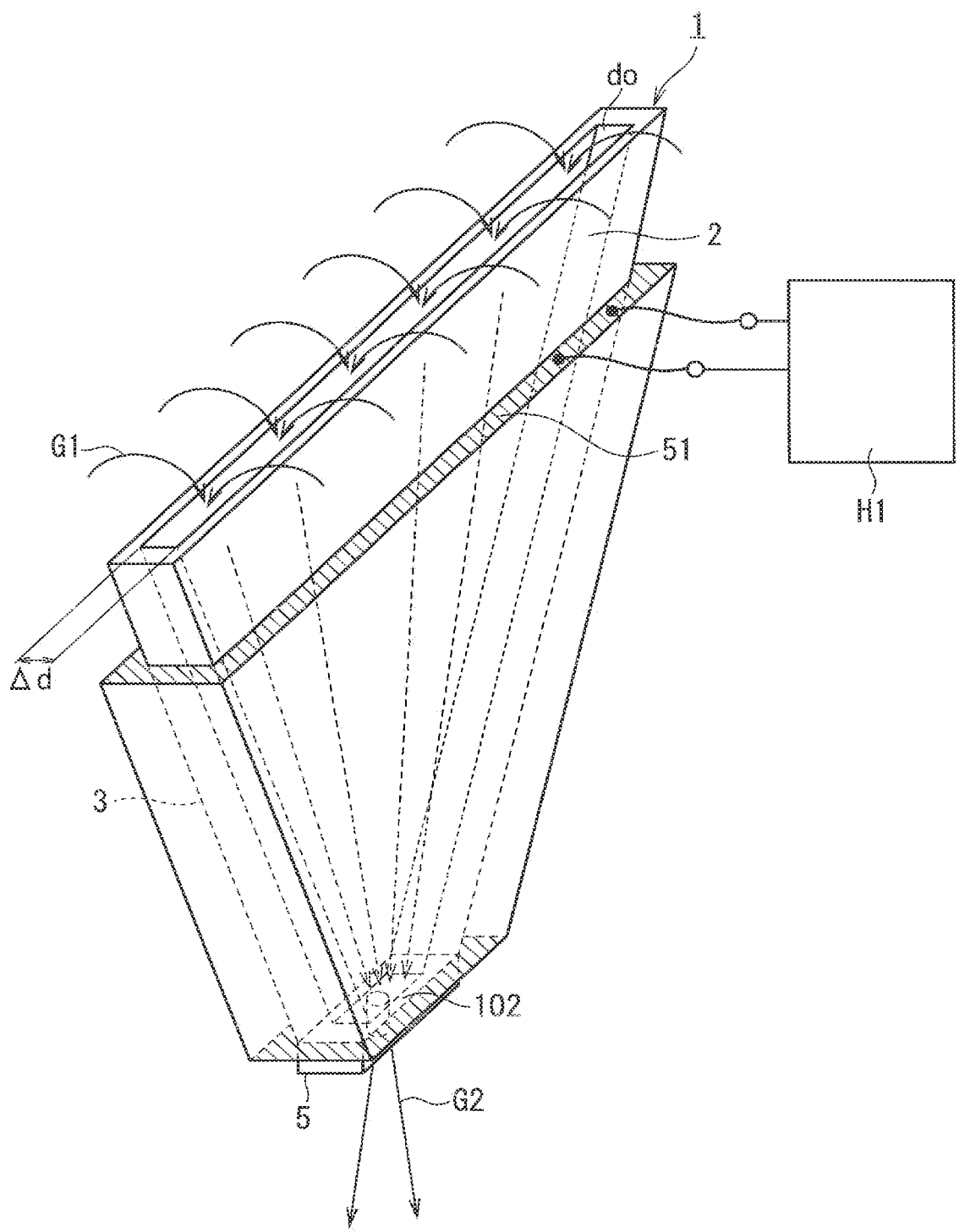
FIG. 16 is a perspective schematically illustrating a configuration of a gas jetting unit 1 according to an eighth exemplary embodiment.

FIG. 16 is perspective view illustrating a configuration of a gas jetting cell unit 1 according to this exemplary embodiment.

As shown in FIG. 16, in this exemplary embodiment, a heater 51 is wrapped around the gas jetting cell unit 1 according to the seventh exemplary embodiment. In order to be able to see an outline of the gas jetting cell unit 1, the heater 51 is shown in perspective. In addition, similar to the third exemplary embodiment, a power supply H1 is provided for heating the heater 51. With the provided heater 51, in the gas jetting cell unit 1, a gas G1 passing through the gap do can be heated. With the heated gas G1, the gas G1 can be radicalized, thus a radical gas G2 can be generated. From the jetting-out hole 102, the radical gas G2 is jetted in a beam shape.

Ninth Exemplary Embodiment

Figure 17:
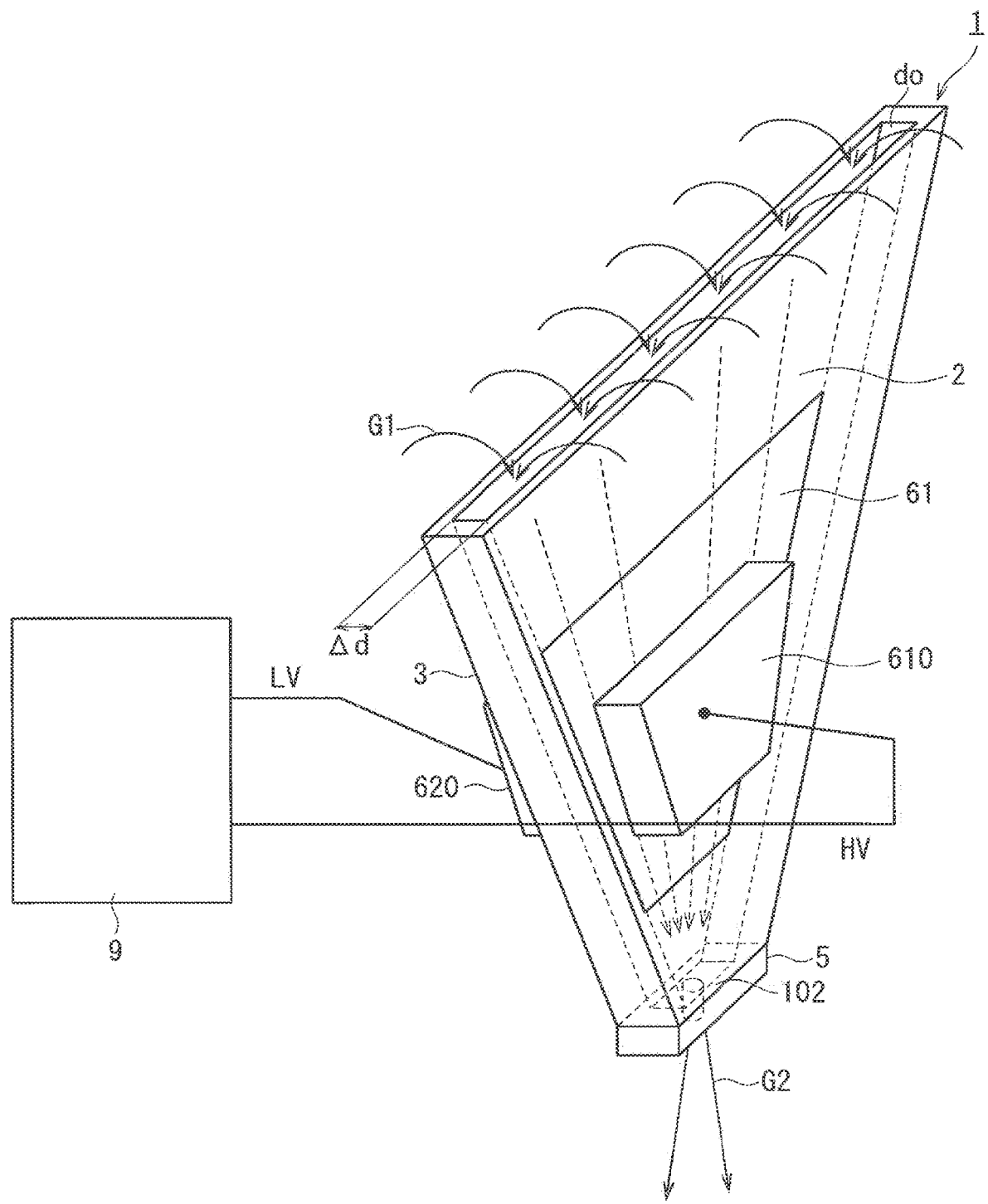
FIG. 17 is a perspective view schematically illustrating a configuration of a gas jetting cell unit 1 according to a ninth exemplary embodiment.

FIG. 17 is a perspective view illustrating a configuration of a gas jetting cell unit 1 according to this exemplary embodiment.

As shown in FIG. 17, in this exemplary embodiment, in a gas jetting cell unit 1 according to the seventh exemplary embodiment, a first electrode (provided to the flat plate 3, where, in FIG. 17, an outline is hidden by the flat plate 3) and a second electrode 61 are provided on the outer side surfaces (surfaces that do not face the gap do) of the flat plates 1, 2.

On the first electrode, a low voltage power feeding plate 620 is provided, while, on the second electrode 61, a high voltage power feeding plate 610 is provided. In addition, as shown in FIG. 17, a high voltage terminal HV of the AC power supply 9 is coupled to the high voltage power feeding plate 610, while a low voltage terminal LV of the AC power supply 9 is coupled to the low voltage power feeding plate 620. Similar to the fourth exemplary embodiment, the AC power supply 9 applies an AC voltage between the high voltage power feeding plate 610 and the low voltage power feeding plate 620.

In the high voltage power feeding, plate 610 and the low voltage power feeding plate 620, for cooling the gas jetting cell unit 1 including the members, a flow channel may be formed to allow cooling water to flow.

In the gas jetting cell unit 1 according to this exemplary embodiment, the AC power supply 9 applies, via the high voltage power feeding plate 610 and the low voltage power feeding plate 620, an AC high voltage between the flat plates 2, 3 that are dielectrics. Therefore, in the gap do, dielectric barrier discharge is generated. By utilizing the dielectric barrier discharge, a high quality radical gas G2 is generated from a gas G. From the jetting-out hole 102, the radical gas G2 is jetted in a beam shape.

In the fan-shaped gas jetting cell units 1 shown in the seventh to ninth exemplary embodiments, by replacing only a cone-shaped gas jetting cell unit 1, contents described in the first to sixth exemplary embodiments can also be achieved in a gas jetting apparatus using the fan-shaped gas jetting cell unit 1. Therefore, the gas jetting cell units 1 shown in the seventh to ninth exemplary embodiments can obviously be used, instead of a cone-shaped gas jetting cell unit 1, as a gas jetting cell unit 1 used in the fifth and sixth exemplary embodiments.

In addition, as described above, in the gas jetting cell units 1 shown in the seventh to ninth exemplary embodiments, it is advantageous that an interval $\Delta d$ of a gap do (a distance between both flat plates 2, 3) is a value in a range from 0.3 mm to 3 mm inclusive, and gas pressure in a vessel unit (i.e. in a gas jetting cell unit 1) is a value in a range from 10 kPa to 30 kPa inclusive.

The invention claimed is:

1. A gas jetting apparatus comprising:
    a vessel unit;
    a gas supply unit for supplying a gas to said vessel unit; and
    a gas jetting cell unit provided in said vessel unit to jet the gas toward a treatment-target object, wherein
    said gas jetting cell unit includes:
        a first cone-shaped member; and
        a second cone-shaped member disposed to surround said first cone-shaped member in a side surface direction so that a gap is formed with a side surface of said first cone-shaped member,
    a gas supply opening of said gas supply unit is disposed spaced apart from and positioned above said gap of said gas jetting cell unit,
    an apex side of said first cone-shaped member and an apex side of said second cone-shaped member face said treatment-target object,
    the gas supplied from said gas supply unit enters from a bottom surface side of said first cone-shaped member and a bottom surface side of said second cone-shaped member into said gap, passes through said gap, and is jetted from the apex side of said first cone-shaped member and the apex side of said second cone-shaped member toward said treatment-target object,
    said gas jetting cell unit further includes a jetting-out unit for jetting a gas toward said treatment-target object,
    an apex side of said first cone-shaped member and an apex side of said second cone-shaped member are coupled to a side surface side of said jetting-out unit,
    said jetting-out unit comprising
        a space unit formed internally, and
        a plurality of jetting-out holes coupled to said space unit, and
    a gas supplied from said gas supply unit passes through said gap, is supplied to said space unit, and is jetted toward said treatment-target object via said plurality of jetting-out holes.

2. The gas jetting apparatus according to claim 1, wherein a portion of said first cone-shaped member which faces said gap and a portion of said second cone-shaped member which faces said gap are made of sapphire or quartz.

3. The gas jetting apparatus according to claim 1, wherein
    a distance between a side surface of said first cone-shaped member and a side surface of said second cone-shaped member in said gap is a value in a range from 0.3 min to 3 mm inclusive, and
    gas pressure in said vessel unit is a value in a range from 10 kPa to 30 kPa inclusive.

4. The gas jetting apparatus according to claim 1, further comprising heating units for heating said first cone-shaped member and said second cone-shaped member.

5. The gas jetting apparatus according to claim 1, further comprising an AC power supply for supplying an AC voltage, wherein
    said first cone-shaped member and said second cone-shaped member are dielectrics,
    said first cone-shaped member is provided with a first electrode unit, said second cone-shaped member is provided with a second electrode unit, and
    when said AC power supply applies an AC voltage between said first electrode unit and said second electrode unit, dielectric barrier discharge is generated in said gap.

6. The gas jetting apparatus according to claim 1, wherein said gas jetting cell unit includes a plurality of gas jetting cell units.

7. The gas jetting apparatus according to claim 6, wherein
    said treatment-target object includes a plurality of treatment-target object, and
    each of said plurality of gas jetting cell units jets out a gas toward each of said plurality of treatment-target objects.

8. The gas jetting apparatus according to claim 6, wherein said plurality of gas jetting cell units jet out a gas toward a single treatment-target object.

9. The gas jetting apparatus according to claim 1, wherein a gas to be supplied from said gas supply unit is a precursor gas.

10. The gas jetting apparatus according to claim 1, wherein a gas to be supplied from said gas supply unit is a source gas served as a raw material of a radical gas.

11. A gas jetting apparatus comprising:
    a vessel unit;
    a gas supply unit for supplying a gas to said vessel unit; and
    a gas jetting cell unit provided in said vessel unit to jet the gas toward a treatment-target object, wherein
    said gas jetting cell unit has a fan shape, and includes:
    a first flat plate; and
    a second flat plate disposed to face said first flat plate to form a gap,
    a gas supply opening of said gas supply unit is disposed spaced apart from and positioned above said gap of said gas jetting cell unit,
    an apex side of said gas jetting cell unit faces said treatment-target object, and
    the gas supplied from said gas supply unit enters from an opening on a wider width side of said fan-shaped gas jetting cell unit into said gap, passes through said gap, and is jetted from the apex side of said gas jetting cell unit toward said treatment-target object.

12. The gas jetting apparatus according to claim 11, wherein said first flat plate and said second flat plate are made of sapphire or quartz.

13. The gas jetting apparatus according to claim 11, wherein
    an interval of said gap is a value in a range from 0.3 mm to 3 mm inclusive, and
    gas pressure in said vessel unit is a value in a range from 10 kPa to 30 kPa inclusive.

14. The gas jetting apparatus according to claim 11, wherein said gas jetting cell unit further includes a jetting-out unit for jetting a gas toward said treatment-target object, said jetting-out unit includes a plurality of jetting-out holes, and the gas supplied from said gas supply unit passes through said gap, and is jetted toward said treatment-target object via said plurality of jetting-out holes.

15. The gas jetting apparatus according to claim 11, further comprising heating units for heating said first flat plate and said second flat plate.

16. The gas jetting apparatus according to claim 11, further comprising an AC power supply for supplying an AC voltage, wherein said first flat plate and said second flat plate are dielectrics, said first flat plate is provided with a first electrode unit, said second flat plate is provided with a second electrode unit, and when said AC power supply applies an AC voltage between said first electrode unit and said second electrode unit, dielectric barrier discharge is generated in said gap.

* * * * *